United States Patent [19]
Goetting et al.

[11] Patent Number: 5,367,207
[45] Date of Patent: Nov. 22, 1994

[54] STRUCTURE AND METHOD FOR PROGRAMMING ANTIFUSES IN AN INTEGRATED CIRCUIT ARRAY

[75] Inventors: F. Erich Goetting, Cupertino, Calif.; David B. Parlour, Pittsburgh, Pa.; John E. Mahoney, San Jose, Calif.

[73] Assignee: Xilinx, Inc., San Jose, Calif.

[21] Appl. No.: 625,732

[22] Filed: Dec. 4, 1990

[51] Int. Cl.⁵ ............... H03K 19/177; H03K 5/08; H03K 19/092; H03K 3/01
[52] U.S. Cl. ................... 307/465; 307/468; 307/202.1; 307/449; 364/784
[58] Field of Search ............... 307/465, 468, 469, 449, 307/202.1, 463; 364/784

[56] References Cited

U.S. PATENT DOCUMENTS

| | | | |
|---|---|---|---|
| 4,937,475 | 6/1990 | Rhodes et al. | 307/202.1 X |
| 4,959,564 | 9/1990 | Steele | 307/202.1 X |
| 4,972,105 | 11/1990 | Burton et al. | 307/202.1 X |
| 4,985,649 | 1/1991 | Schuett et al. | 307/465 |
| 5,015,885 | 5/1991 | El Gammal et al. | 307/465 |
| 5,021,690 | 6/1991 | Linz | 307/465 |

Primary Examiner—Edward P. Westin
Assistant Examiner—David R. Bertelson
Attorney, Agent, or Firm—Edel M. Young

[57] ABSTRACT

This invention provides a structure and method for interconnecting logic devices through line segments which can be joined by programming antifuses. One of several programming lines can be connected through an interconnect line segment to each terminal of each antifuse in the array. Interconnect line segments connected to opposite terminals of the same antifuse are connected to a different programming line in order to be able to apply different voltages to the two terminals of the antifuse. An addressing structure selectively connects interconnect line segments to their respective programming lines, and programming voltages applied to the programming lines cause a selected antifuse to be programmed. A novel addressing feature sequentially addresses two transistors for the line segments to be connected, and takes advantage of a capacitive pumped decoder to maintain the addressed transistors turned on while programming voltages are applied. The structure also allows for testing of logic devices by applying test voltages to the programming voltage lines and/or sensing logic device output on programming voltage lines. The structure and method also permit measuring resistance of the programmed antifuses. No separate testing overhead structure is needed.

18 Claims, 13 Drawing Sheets

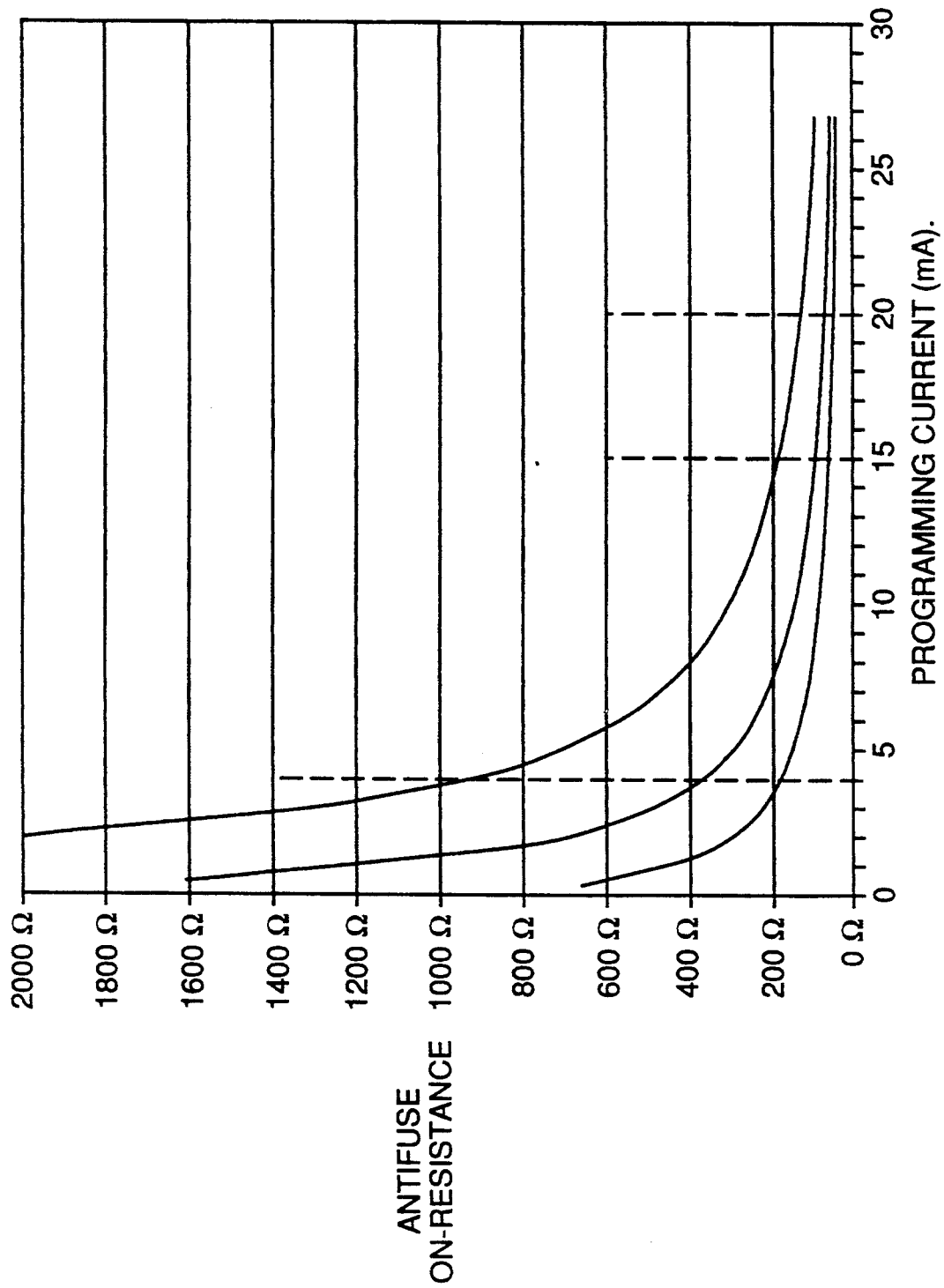

STRUCTURE AND METHOD FOR PROGRAMMING ANTIFUSES IN AN INTEGRATED CIRCUIT ARRAY

RELATED APPLICATION

This application relates to commonly assigned co-pending application Ser. No. 07/622695, entitled "STRUCTURE AND METHOD FOR TESTING ANTIFUSE RESISTANCE AND CIRCUIT SPEED", invented by David B. Parlour and F. Erich Goetting, attorney docket no. M-1482 US, incorporated herein by reference.

FIELD OF THE INVENTION

This invention relates to the programming of programmable integrated circuit structures, in particular to the shorting of antifuses to connect elements in an array of logic elements.

BACKGROUND OF THE INVENTION

Elements for programming PROM's, EEPROM's and logic arrays have included fuses and transistors. It is also possible to make programmable connections using shortable elements (antifuses). An antifuse is an element which before programming has a high impedance and which upon application of an appropriate voltage changes to a low impedance conductive state. A thin dielectric, such as silicon dioxide between two conductive regions, such as aluminum, can serve as an antifuse, programmable by the current and local high heat which occur when sufficient voltage is applied to cause current to flow through the dielectric.

Two common programmable arrays are shown in FIGS. 1 and 2. In FIG. 1, horizontal row lines R1 through Rn are connected to vertical column lines C1 through Cm through interconnects each comprising a diode and a programmable connector. The programmable connectors of FIG. 1 are antifuses, although fuses are also commonly used in this application. The diodes and antifuses of FIG. 1 are identified by the row and column which they connect. Thus the diode and antifuse which connect row R2 to column C1 are diode R2,C1 and antifuse R2,C1. To program the array of FIG. 1 so that row R2 is connected to column C1, all columns except C1 are brought to a high voltage and all rows except R2 are brought to a low voltage. Row R2 is brought to a high voltage and column C1 is brought to a low voltage. This combination of voltages causes diodes at intersections not including row R1 or Column C1 to be back biased. There is no voltage drop at intersections of column C1 with rows other than R2 and there is no voltage difference at intersections of row R2 with columns other than C1. However, diode R2,C1 is forward biased so that the full voltage difference is experienced by antifuse R2,C1. If the voltage levels are sufficient to program the particular antifuse, antifuse R2,C1 will short out and form a permanent connection between row R2 and column C1 through diode R2,C1. This technique works well for memory arrays. However, the diodes prevent two-way flow of current and thus the above method may be unacceptable for certain programmable logic applications where bidirectional current flow is required.

A second technique, shown in FIG. 2, eliminates the use of diodes, using simply cross point switch connections, and relies on the use of three voltage levels for selecting the intersection to be connected. As shown in FIG. 2, columns C1 through Cm can be connected to rows R1 through Rn by connecting antifuses at the appropriate intersections. An antifuse is indicated by a ⊕ at the intersection. As with FIG. 1, the antifuses will be identified by the rows and columns which they connect.

In order to connect column C1 to row R2, all rows and columns except C1 and R2 are brought to an intermediate voltage level. Column C1 is brought to a high voltage level and row R2 is brought to a low voltage level. With this combination, antifuses at intersections not including row R2 or column C1 experience no voltage difference. Antifuses connecting rows except R2 to column C1 experience the voltage difference between the high and intermediate levels. Antifuses connecting columns except C1 to row R2 experience the voltage difference between the intermediate and low levels. If the intermediate voltage level is half way between the high and low voltage levels, the voltage difference experienced by antifuse R2,C1 is twice that of other elements in row R2 or column C1. If the antifuses can be reliably manufactured such that the voltage difference between the high and low voltages is sufficient to short the element and the voltage rise or difference between intermediate and the high or low voltages is not sufficient to short the element, this technique can be used to program an array of connections without having diodes in the signal path, in contrast to the array of FIG. 1.

Note, however, that after programming the first connection, for example R2,C1, row R2 and column C1 can no longer be brought to different voltage levels for future programming. If it is next desirable to connect row R2 to column Cm, both row R2 and column C1 will be brought to a low level, other columns except for columns C1 and Cm will be brought to an intermediate level, and column Cm will be brought to a high level. Thus in order to place the programming voltage on element R2,Cm, half the programming voltage must be placed across all elements in row R2, column Cm and also column C1, except of course for element R2,C1 which is already programmed.

If it is next desirable to connect element Rn,C1 row Rn will be brought low. Column C1 will be brought high thus placing high voltages on row R2 and column Cm which have been previously connected. But this action places a programming voltage not only on element Rn,Ci which is to be programmed but also on element Rn,Cm which is not intended to be programmed.

Structures such as shown in FIG. 1 are preferred for memories, where isolation of elements is provided by the diodes, and where it is not necessary to have bidirectional current flow. Structures such as shown in FIG. 2 are preferred for interconnect lines where bidirectionality is important and lack of isolation can be dealt with. FIG. 3 shows a structure in which isolation is not provided by diodes but is accomplished by dividing the entire array into smaller units for isolation. When the structure of FIG. 3 is to be programmed, transistors in units BR1,1 and BC1,1 can be turned off while programming the antifuses of section 1,1, thus avoiding the possible erroneous programming which would occur if the entire array were interconnected. Similarly, other sections can be isolated for antifuse programming. For operation of the device in which the antifuse array of FIG. 3 is located, isolating transistors such as those in BR1,1 and BC1,1 are turned on so that the array is interconnected as desired.

Further structures and methods for programming antifuses are known. Elgamal et al., in U.S. Pat. No. 4,758,745 describes a structure and method for programming antifuses which, as shown in FIG. 4 (Elgamal FIG. 1B), uses one channel control logic unit 23 for controlling the voltage to be applied to each line in an array. As shown in FIG. 5, (Elgamal FIG. 5, which is described in Elgamal col. 8, starting at line 53), pass transistors 40 are provided in parallel with programmable elements (antifuses) 46. Pass transistors 40 are used as feed through transistors during programming of one of the programmable elements 46. By turning on all transistors in a horizontal channel except the transistor for which an antifuse is to be programmed, a programming voltage can be applied to that antifuse. For example by turning on all transistors in channel 62c except transistor 40, and applying low and high voltages to opposite ends of the channel 62c, it is possible to generate enough voltage across terminals of antifuse 46 to program antifuse 46. Because the programming voltage must be applied through a series of transistors such as transistor 40, the programming current for programming antifuse 46 will be limited by the resistance of the transistors in channel 62c through which the current must flow. Since final resistance of the programmed antifuse depends upon current during programming, the final antifuse resistance is also limited by the resistance of transistors in channel 62c. Further, the arrangement of FIG. 5 is not easily scaled. Since the resistance of a channel such as 62c depends upon the number of transistors in series, if one were to design a set of devices using the principles of FIG. 5, it would be necessary to use different design rules for each device having a different number of transistors in series. If decoders were added midway when scaling to a larger device, so that a programming current was applied through only a set number of transistors in series, the efficiency of having decoding performed entirely at the periphery of the chip would be lost.

Finally, depending upon the number of antifuses to be programmed in one channel and the order in which they are programmed, the final antifuse resistance can vary considerably.

SUMMARY OF THE INVENTION

According to the present invention, a structure and method are provided which allow a programming voltage to be applied to interconnect line segments using only a single transistor between the programming voltage source and the interconnect line segment, such that the programming current flows through only two programming transistors between the two programming voltage sources. In addition, the structure of the present invention allows both programming and testing to be performed with one structure, so that no separate overhead structure is required for testing. No change in design rules is needed when the number of antifuses in an integrated circuit chip is scaled up or down. Further the resistance of a programmed antifuse is both predictable and small.

Another feature allows antifuses which require a high programming voltage to be used on the same chip with SRAM circuitry which preferably is too small to tolerate a voltage high enough to program an antifuse.

With the present invention, the logic for decoding the addresses of two interconnect line segments to be connected through an antifuse simply turns on pass transistors, which causes the particular interconnect line segments to be connected to the programming voltage supply lines. Logic needs to be provided only once for the entire chip in order to select voltages to be applied to the programming voltage supply lines.

According to another novel feature of the present invention, the number of lines in the addressing structure needed to address all interconnect line segments in an array can be reduced by taking advantage of the capacitance of a decoder circuit. The decoders which turn on transistors for applying programming voltage to the line segments connected to two terminals of an antifuse are addressed sequentially rather than simultaneously, although the programming voltages are applied simultaneously. The capacitance of the decoders is sufficient to hold these transistors on for a short time after they are no longer addressed. During this short time when one transistor has been turned on and its line segment has been connected to a programming voltage source, the decoder for the other line segment to be connected is addressed and programming voltages are applied to the two line segments, thereby programming the antifuse connected to the two addressed line segments. Addressing only one decoder at one time avoids erroneously addressing an unintended decoder.

Further, with the present invention, the polarity of the programming voltage can be determined by the programming hardware at the time the chip is programmed, and is not limited by the circuitry. Indeed the programming hardware may be programmed to apply a programming voltage sequentially in both polarities in order to further reduce resistance of the programmed antifuse. With many antifuse technologies, it is preferred to apply the programming voltage in a particular direction. According to the present invention, it is possible in all cases to apply the voltage in either or both directions and yet this choice is achieved with no more silicon area than required for a single direction.

In a preferred embodiment of the present invention, all programming transistors are made with NMOS technology. This simplifies the manufacturing process, allows adjacent transistors to be more closely packed, and therefore allows the entire chip to be more dense.

An advantage of the present invention is that, conceptually, each antifuse is arranged between a parallel pair of programming lines, one programming transistor connecting the antifuse to each of the programming lines. The programming lines each pass through the entire chip. Thus an antifuse may be accessed through only two programming transistors no matter how large the array.

The structure of the present invention allows for testing of logic devices which are part of the integrated circuit structure and which are to be interconnected by an end user. Testing is performed using the programming lines for applying test vectors and observing results. Test signals are applied through a combination of programming transistors and resistive pull-up transistors. The pull-up transistors are already included in the circuit to apply intermediate voltages required during programming. These intermediate voltages are used as discussed in connection with FIG. 2. For testing, logical high test signals are applied through the pull-up transistors and logical low test signals are applied through programming voltage lines. This allows all possible combinations of high and low signals to be applied to the logic devices without requiring additional test circuitry, and, of course, without requiring that any antifuses be programmed.

As a further feature of the present invention, a pump-up circuit providing a high transistor gate voltage to programming transistors is controlled by a low voltage (typically 5 volt) signal also used for voltage memory cells.

BRIEF DESCRIPTION OF THE DRAWINGS

FIG. 9 shows ranges of final resistance vs. programming current for an antifuse device.

DETAILED DESCRIPTION OF A PREFERRED EMBODIMENT

Figure 6A:
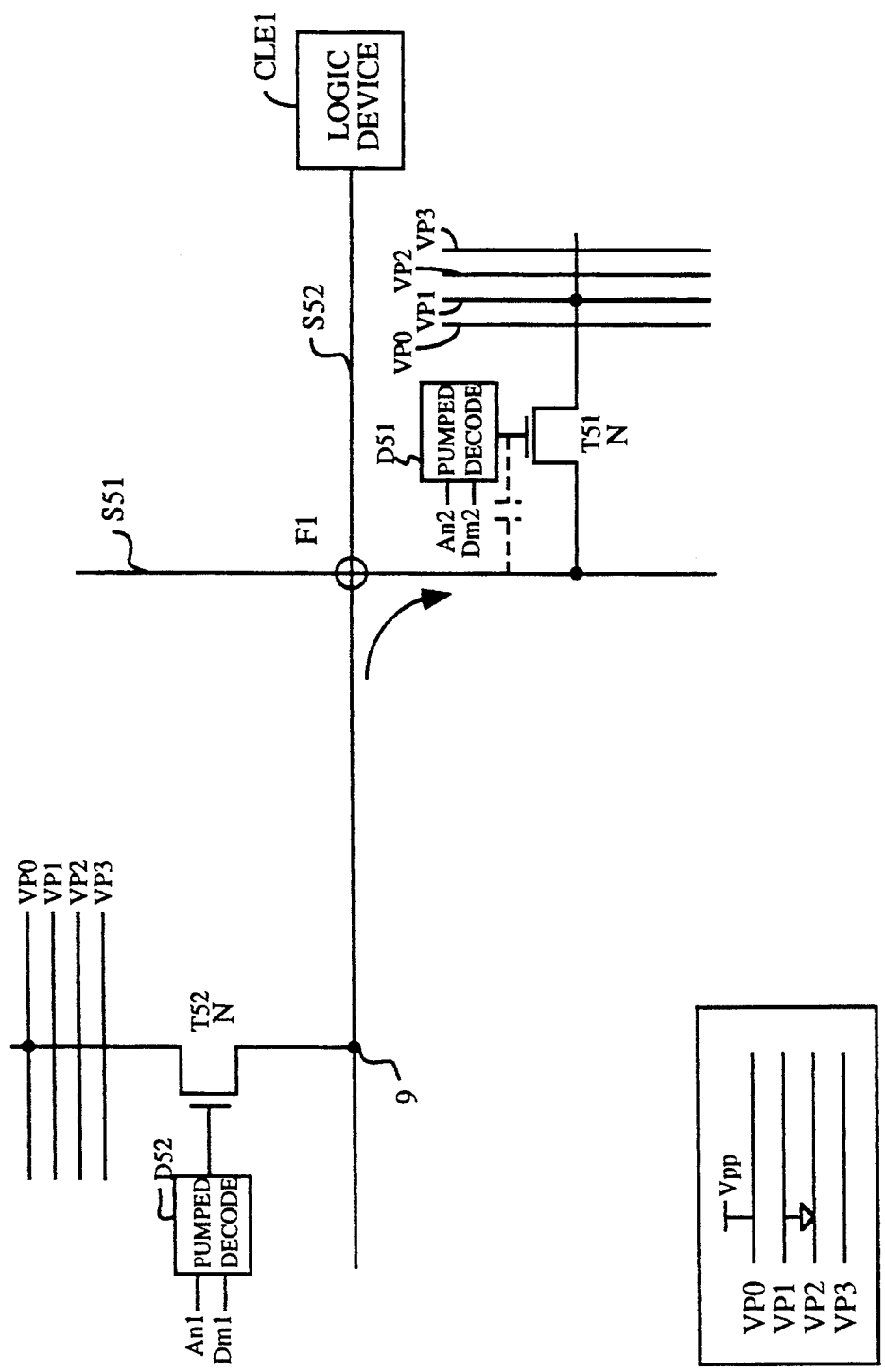
FIGS. 6a, 6b show programming circuitry in accordance with the invention.

Antifuse Programming through Programming Bus with Fixed Connections to Line Segments FIG. 6a shows antifuse F1 at the intersection of two interconnect line segments S51 and S52. The antifuse is programmed by providing sufficiently different voltages to line segments S51 and S52 which in turn contact the two terminals of antifuse F1. In an array in which the invention is advantageously used, comprising line segments, logic devices, and antifuses for interconnecting line segments, a programming voltage can be applied to each interconnect line segment of the array through a pass transistor. According to the invention, one programming pass transistor is provided for each interconnect line segment. (More than one antifuse may be and usually is connected to one line segment, as will be discussed in connection with FIG. 7a.) A programming bus to which programming voltages can be applied extends through the array, with each line segment in the array being connectable through its pass transistor to one line of the programming bus. In order to program an antifuse the two terminals of the antifuse must be connected to line segments which connect to different lines of the programming bus.

As shown in FIG. 6a, line segment S51 is connected through transistor T51 to programming voltage line VP1. Line segment S52 is connected through transistor T52 to programming voltage line VP0. FIG. 6a shows four programming voltage lines VP0, VP1, VP2, and VP3 in the programming bus. The antifuse is programmed by applying sufficiently different voltages to the two lines of the programming bus which are connected through programming transistors and corresponding line segments to the two terminals of the antifuse, and turning on the programming transistors while the voltages are applied to those programming bus lines. Any voltage can be applied to any programming bus line; therefore the direction of current flow through the antifuses such as F1 can be selected at the time of programming.

NMOS Technology and Pumped Decoder

In a preferred embodiment, all programming voltage transistors, such as T51 and T52, are NMOS transistors having fairly large current carrying ability (typically 20 ma). Using only NMOS transistors has at least three advantages over using mixed NMOS and PMOS transistors. NMOS transistors have about twice the conductivity of PMOS transistors, an important factor for the high current needed to program antifuses. Further, it is possible to pack adjacent transistors more closely when they are the same conductivity type and space is not needed to separate N-wells from P-wells. Finally, using only a single conductivity type (N or P) simplifies the manufacturing process.

The NMOS programming transistors are controlled by pumped decoders such as D51 and D52, which apply a gate voltage slightly higher than the programming voltage by means discussed below, in order to allow the full programming voltage and high current to be applied across the antifuse. A pumped decoder allows low voltage address and data signals to control programming of the antifuses by pumping up the low voltage signals to higher programming voltages.

In one embodiment, SRAM (static random access memory) cells for configuring the array are included on the same chip as is the antifuse array. The SRAM cells require low voltage (5 volt) address (row) and data (column) signals for loading the SRAM cells with configuration information at power-up. It is most efficient to use the same address and data lines which configure the SRAM cells to also control programming of the antifuses. Advantageously, this is possible with the present invention. The low voltage signals which control the SRAM cells also address pumped decoders which allow high programming voltages to be applied to antifuses.

Figure 6B:
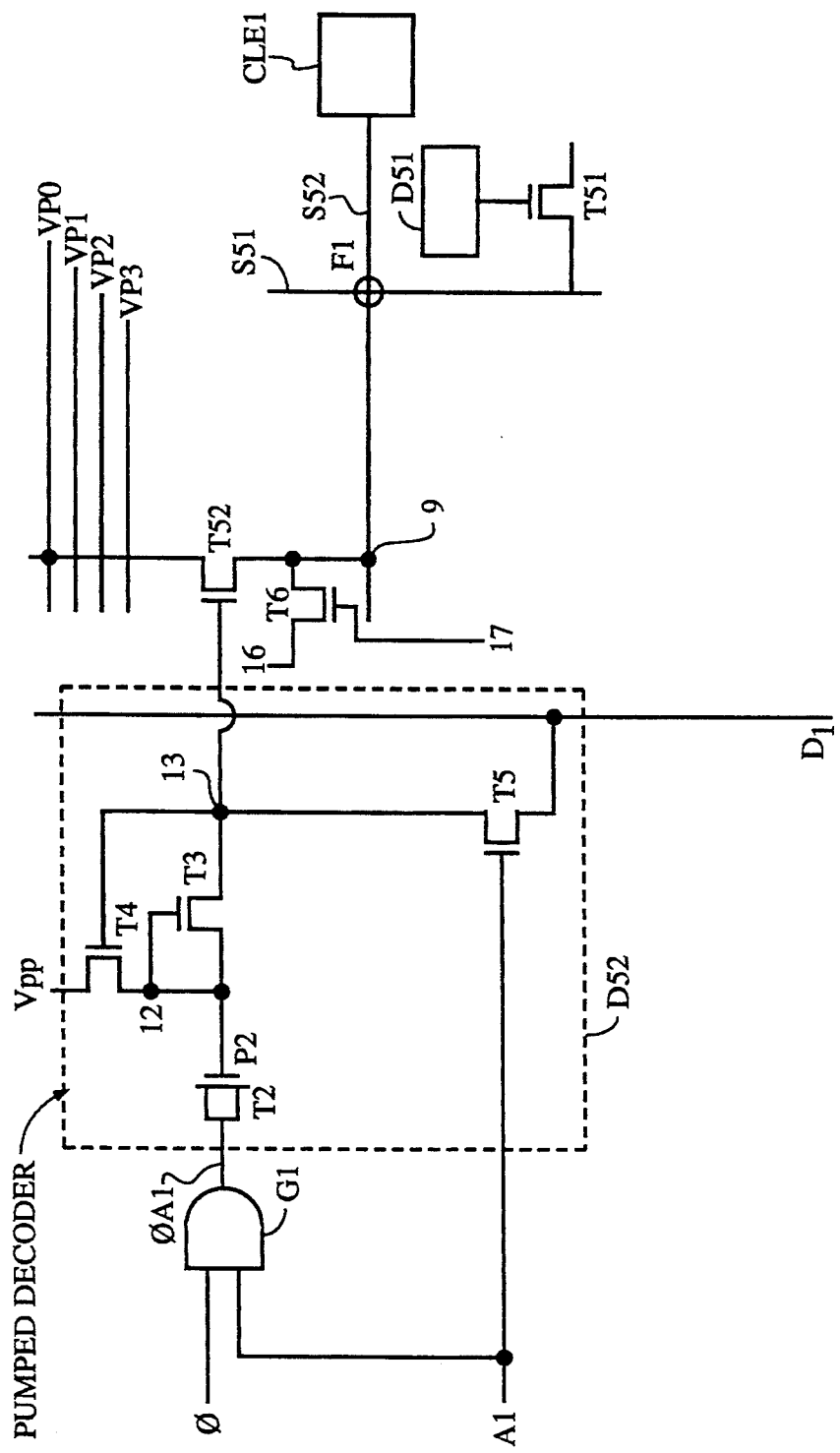
Figure 7A:
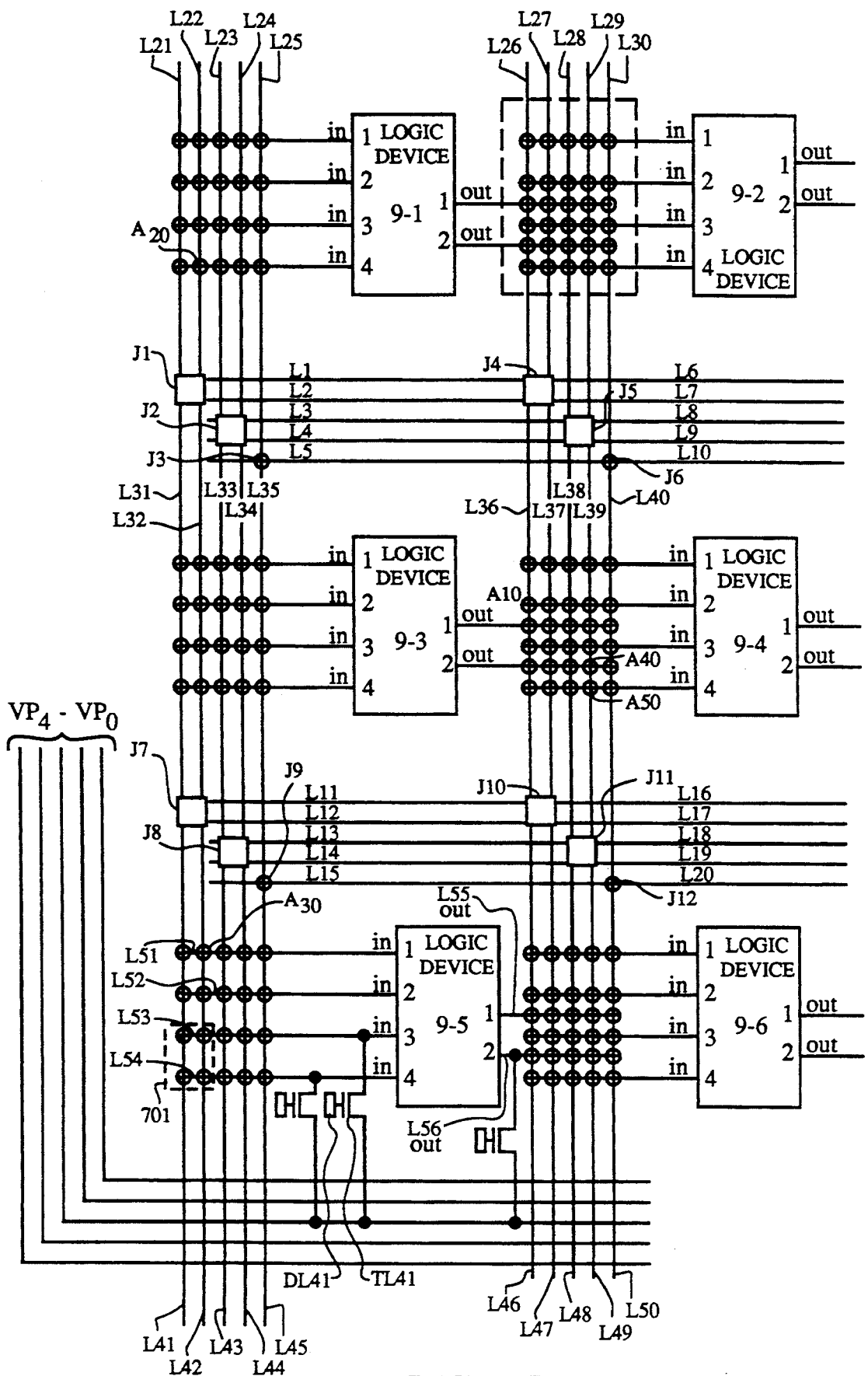
FIGS. 7a, 7b, 7c, 7d show antifuse array circuitry in accordance with the invention.

As shown in FIG. 6b, pumped decoder D52 of FIG. 6a may be formed from transistors T2 through T5, transistor T2 having its source and drain commonly connected to act as a capacitor. Also shown in FIG. 6b are the elements shown in FIG. 6a. The structure shown in FIG. 6b is typically one element in an array of such structures, each structure being addressed by a different combination of address lines A0 through An to AN and data lines D0 through Dm to DM. An array having such structures is shown in FIG. 7a, and is discussed below.

Regarding the operation of the pumped decoder of FIG. 6b, a global clock signal $\phi$, typically switching between 0 and 5 volts at a frequency on the order of 10 MHz, is applied to AND gate G1. Global clock signal $\phi$ generates a row clock signal $\phi_{A1}$ when line A1 is at logical one. To allow the pumped decoder of FIG. 6b to pump up the voltage on node 13, both of lines A1 and D1 must be brought to a logical one voltage level (5 volts).

When both lines A1 and D1 are addressed, the voltage at node 13 is pumped up by clock signal $\phi_{A1}$ alternately pulling charge onto the gate of transistor T2, which is acting as plate P2 of a capacitor, and then moving charge to the gate of transistor T52.

The known pumped decoder circuit D52 of FIG. 6b will now be explained. When logical one (5 volt) signals are applied to address and data lines A1 and D1, transistor T5 charges node 13 to roughly 4 volts (one threshold voltage $V_t$ below the voltage on line D1; threshold voltage is the voltage difference between gate and source/drain of an MOS transistor needed to turn on the transistor). Assuming that $\phi_{A1}$ is at logical zero, capacitor plate P2 will have charged to one $V_t$ below node 13 through transistor T4. In this quiescent state, current is not flowing through transistors T2 through T5, though these transistors may be on. Since A1 carries a logic one, as $\phi$ rises from 0 to 5 clock signal $\phi$A1 rises, the rising voltage induces a corresponding rise at node 12 through the capacitor formed by transistor T2. As node 12 rises above the threshold voltage of transistor T3, transistor T3 turns on and current flows from node 12 to node 13 (from plate P2 to the gate of transistor T52). During this time transistor T4 is off. When $\phi$, and correspondingly, $\phi$A1 decrease from 5 volts to 0 volts, the capacitor formed by transistor T2 induces a decreasing voltage on node 12. When the voltage on node 12 approaches the voltage on node 13, transistor T3 turns off. When the voltage on node 12 decreases more than one $V_t$ below node 13, transistor T4 turns on, thereby transferring charge from Vpp to node 12. This completes a pumping cycle. Typically tens or hundreds of cycles are required to bring node 13 to its maximum high voltage level, typically 17-18 volts. The maximum voltage at node 13 is determined by Vpp and transistor T4. As the voltage at node 13 reaches one $V_t$ above Vpp, current no longer flows from node 12 to node 13 when transistor T3 is on, but instead flows back to Vpp when transistor T4 is on.

Assuming the threshold voltage of transistor T4 is the same as the threshold voltage of transistor T52, and the supply voltage Vpp is the same as the high programming voltage VP0, transistor T52 will allow the full voltage VP0 to be applied to node 9 for programming antifuse F1. Note that supply voltage Vpp is not necessarily the same as programming voltage VP0, since voltage VP0 may be low, and the high programming voltage may be applied to the other terminal of the antifuse.

After a node for addressing a transistor has been pumped up, two different options may occur. The charge may be held on the node for a period of time while the transistor for accessing the other terminal of the antifuse is addressed and turned on, or if the transistor for addressing the opposite terminal is already on, the node for addressing the transistor may be held high only long enough for the antifuse to be programmed. The node is then returned to a low voltage so that the transistor is turned off. Sequential addressing of opposite antifuse terminals is discussed below in connection with FIG. 7d. In any case, charge is held on node 13 until antifuse F1 has been programmed. The charge is held on node 13 (as discussed further below) by bringing line A1 low before bringing line D1 low. Node 13 is discharged by holding line A1 at 5 volts and bringing the global clock low while D1 is brought low. In response, node 13 discharges through transistor T5 to line D1.

Application of the Structure and Method of the Present Invention

FIG. 7a shows an array circuit in which the present invention advantageously operates. Additional description of configurable arrays and logic devices in which the present invention advantageously operates may be found in U.S. Pat. Nos. 4,870,302, and 4,706,216, incorporated herein by reference, and in "The Programmable Gate Array Data Book" ©1989, available from Xilinx, Inc., 2100 Logic Drive, San Jose, Calif. 95124, also incorporated herein by reference. As shown in FIG. 7a, a plurality of horizontal and vertical interconnect line segments L1 through L54 are positioned in an integrated circuit device with a plurality of logic devices 9-1 through 9-6. Each interconnect line segment L1 through L54 is connected through a programming transistor to a programming voltage line VP0 through VP4, as shown in FIG. 6b. For simplicity, only a few programming transistors, for example TL41, and their associated pumped decoders, for example DL41, are shown in FIG. 7a. Antifuses for interconnecting line segments L1 through L54 are positioned at many intersections of the line segments and are represented as ⊕.

Figure 7B:
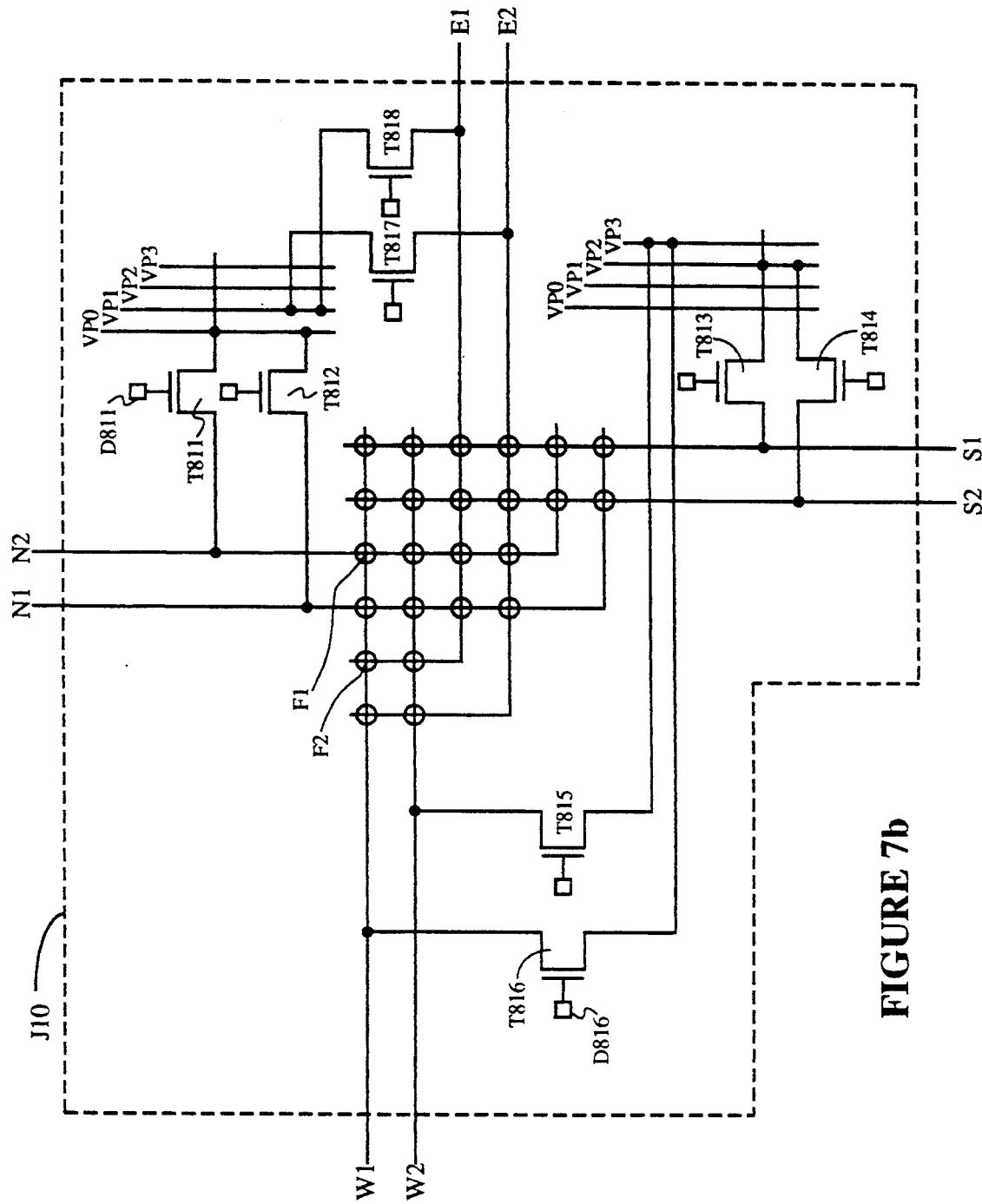

Also included in the array of FIG. 7a are interconnection boxes J1 through J12. Within each of these interconnection boxes are interconnect means, preferably antifuses, for selectively interconnecting lines which extend into the boxes. FIG. 7b shows interconnection box J10, in which two lines enter from each of the compass directions N, S, E, and W. Antifuses allow each of these lines to be connected to each other line extending into the box except for the other line coming from the same direction. The twenty-four antifuses shown in FIG. 7b allow this choice.

Programing Bus and connections to Line Segments

In order to program any of the antifuses, it must be possible to provide the programming voltage across each antifuse. As shown in FIG. 7b, each line segment N1, N2, E1, E2, S1, S2, W1 and W2 has a fixed connection through a transistor to one of the lines VP0 through VP3 in the programming bus. The programming bus must contain sufficient lines that interconnect line segments feeding opposite terminals of an antifuse are always connected to different lines in the programming bus so that different voltages can be applied to the opposite terminals of each antifuse. For a geometry in which lines enter a connection region from four compass points, four programming bus lines may be able to provide sufficient flexibility to always connect opposite terminals of each antifuse to different bus lines. However, if more varied connection patterns will be used, additional programming bus lines may be needed. A presently preferred embodiment uses five lines in the programming bus. Additional programming lines beyond four may program interconnect lines which interconnect alternating logic devices, for example. Five programming lines are shown in the embodiment of FIG. 7a.

FIG. 7b shows an arrangement for programming the 24 antifuses to connect interconnect line segments in four compass directions using a programming bus having four lines (or using four lines of a larger programming bus). By allocating each of the four compass directions to a different one of the four programming lines, it is possible to provide the necessary voltage difference to each of the 24 antifuses.

To program antifuse F1, segment N2 is connected to programming bus line VP0 through transistor T811 by addressing pumped decoder D811. (Addressing the decoders will be discussed in connection with FIGS. 7c and 7d.) Segment W1 is connected to programming bus line VP3 through transistor T816 by addressing pumped decoder D816. To connect segment N2 to segment W1 through antifuse F1, while transistors T811 and T816 are on, a first programming voltage is applied to programming voltage line VP0 and a second programming voltage is applied to programming voltage line VP3. There is typically a preferred direction for applying these programming voltages, depending on the makeup of the antifuse. With the present invention, it is possible to apply the two programming voltages in either direction, or indeed to apply sequential programming voltages of opposite polarities.

Low Resistance of Programmed Antifuses

Because the voltages on the gates of transistors T811 and TB16 are pumped higher by at least one threshold voltage than the programming voltages applied to programming lines VP0 and VP3, the full voltage difference applied to programming lines VP0 and VP3 will appear at antifuse F1. Further, because the programming current must pass through only the two transistors T811 and T816 and antifuse F1 between the major voltage source which supplies the programming voltages and current, it is possible to pass high current through transistors T811 and T816 and antifuse F1 as antifuse F1 is being programmed. The effect of the high current is to reduce resistance between the two terminals of the antifuse It is expected that typical resistance of such programmed antifuses will be on the order of 100 ohms.

FIG. 9 shows the relationship between the programming current and the final resistance of an antifuse. At a low programming current of some 4 mA, which cannot be exceeded by prior art designs in which programming current may pass through 5 to 8 transistors in series, resistance of the programmed antifuse will remain on the order of 200 to 900 ohms. Such values of resistance have a significant detrimental effect on circuit performance. The high resistance of such prior art designs causes signal delay, and the large spread in final resistance causes unpredictability of the delay, which may cause unacceptable circuit operation. By contrast, with the present invention, in which programming current is on the order of 15-20 mA, the approximately 100 ohm resistance of programmed antifuses is small in comparison with other resistances in the circuit, so that delay is both small and predictable, and resulting circuit performance is enhanced relative to the above described prior art.

Figure 8A:
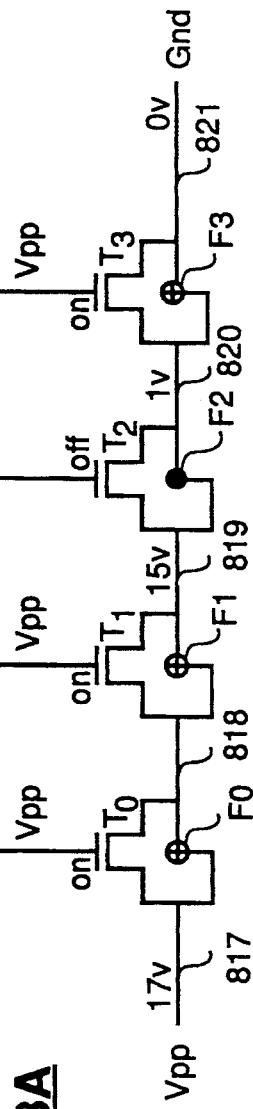
FIGS. 8a and 8b show a comparison of the antifuse programming arrangement of a prior art structure to the antifuse programming arrangement of the present invention.
Figure 8B:
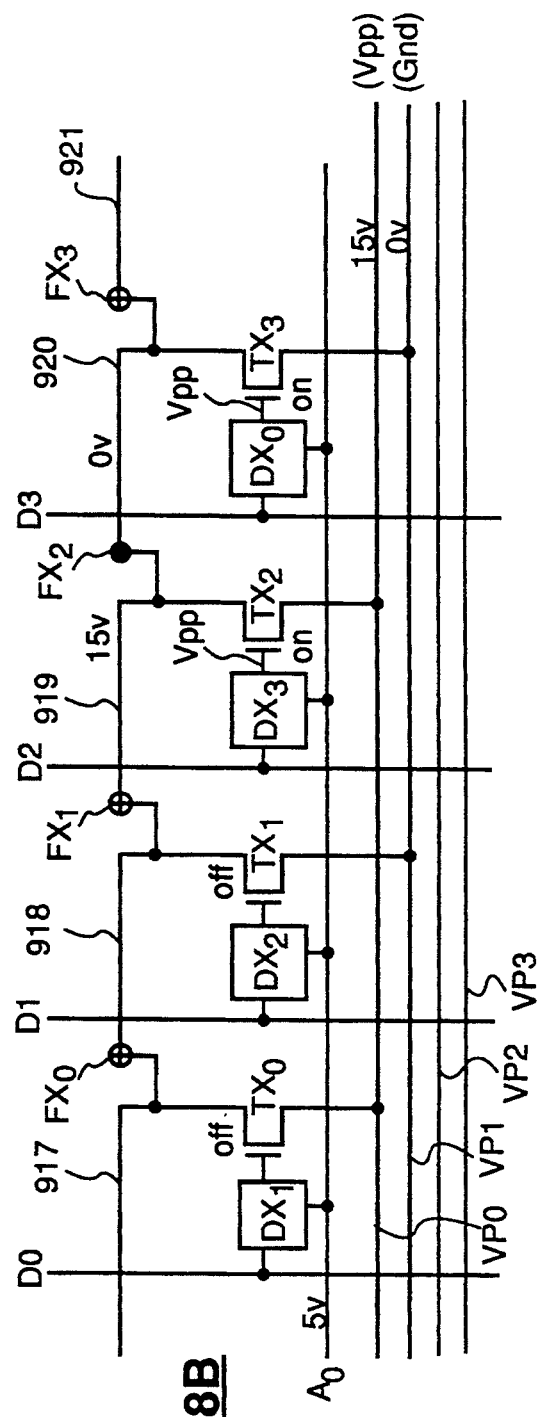

FIGS. 8A and 8B show programming circuits of the prior art (FIG. 8A) and the present invention (FIG. 8B), and contrast the serial nature of a prior art programming circuit with the parallel nature of the present invention. Programmed antifuses are indicated by a solid black dot. As shown in FIG. 8A, when an antifuse is being programmed, current flows in series through programming transistors and the antifuse. For programming, a programming voltage, on the order of 17 volts in the present example, is applied to line segment 817, and ground voltage is applied to line segment 821. To program antifuse F2, high voltages, are applied to the gates of transistors T0, T1, and T3, and a low voltaqe, zero volts, is applied to transistor T2. The programming voltage applied across antifuse F2 will be at least one threshold voltage below the voltage applied to the gates of transistors T0 and T1. When a high programming current is flowing, this voltage will also be lower than the voltage applied to segment 817 because of the resistance of transistors T0, T1 and T3. It can be seen that when the device is scaled to provide a larger number of transistors in series, the resistance of these transistors can produce a significant decrease in the current available for programming the desired antifuse.

By contrast, as shown in FIG. 8B, antifuses $FX_0$, $FX_1$, $FX_2$, and $FX_3$ are arranged in parallel between programming voltage lines VP0 and VP1. To program antifuse $FX_2$, current passes through only two transistors $TX_2$ and $TX_3$ regardless of how many antifuses are in the line and regardless of which other antifuses have been programmed.

Advantageously, the use of a parallel programming arrangement such as shown in FIG. 8B results in a smaller total silicon area (fewer and smaller programming transistors) for a particular amount of resistance, or a lower resistance for a particular silicon area.

Programming Transistor Resistance Estimation

Just as antifuse programmed resistance will vary from chip to chip, so also will the resistance of programming transistors vary from chip to chip. It is possible to obtain an improved estimate of on-resistance of the programming transistors of a chip by providing one or more pairs of test transistors manufactured by the same process as the programming transistors but connected directly between a pair of programming lines so that when the pair of test transistors is turned on, the resistance of the pair can be measured directly. It is presently considered sufficient to provide only a single pair of test transistors for determining the expected resistance of programming transistors in the entire chip.

Programmed Antifuse Resistance Calculation

Further, with the arrangement of FIG. 8B, not only can the programming current and voltage be high for a resulting low antifuse on-resistance, but the resistance of the programmed antifuse can be measured. If a low voltage, say 1 volt, is applied to a programmed antifuse by applying a logical one to the corresponding address and data lines and applying 1 volt to one of the programming lines and zero volts to the other programming line, the programming transistors will operate in their linear range (range in which resistance times current equals voltage). Resistance of the programming transistors can be closely estimated as described below, so that the equation $$V = I \times (R_{T1} + R_F + R_{T2})$$

where

V is the (one volt) applied voltage, $R_{T1}$ and $R_{T2}$ are the resistances of the corresponding programming transistors when operating in the linear range, and $R_F$ is the on-resistance of the programmed antifuse can be solved for antifuse resistance, since all other terms of the above equation are known or can be estimated. Further, as can be seen in FIG. 9, a high programming current of 15-20 mA produces not only a low resistance but a predictable resistance. The combination of low resistance and predictable resistance makes it both possible and less important to calculate the resistance of a particular signal path. Antifuse resistance may be calculated directly after the antifuse is programmed to determine that the antifuse is functioning properly.

Addressing Pumped Decoders

Figure 7C:
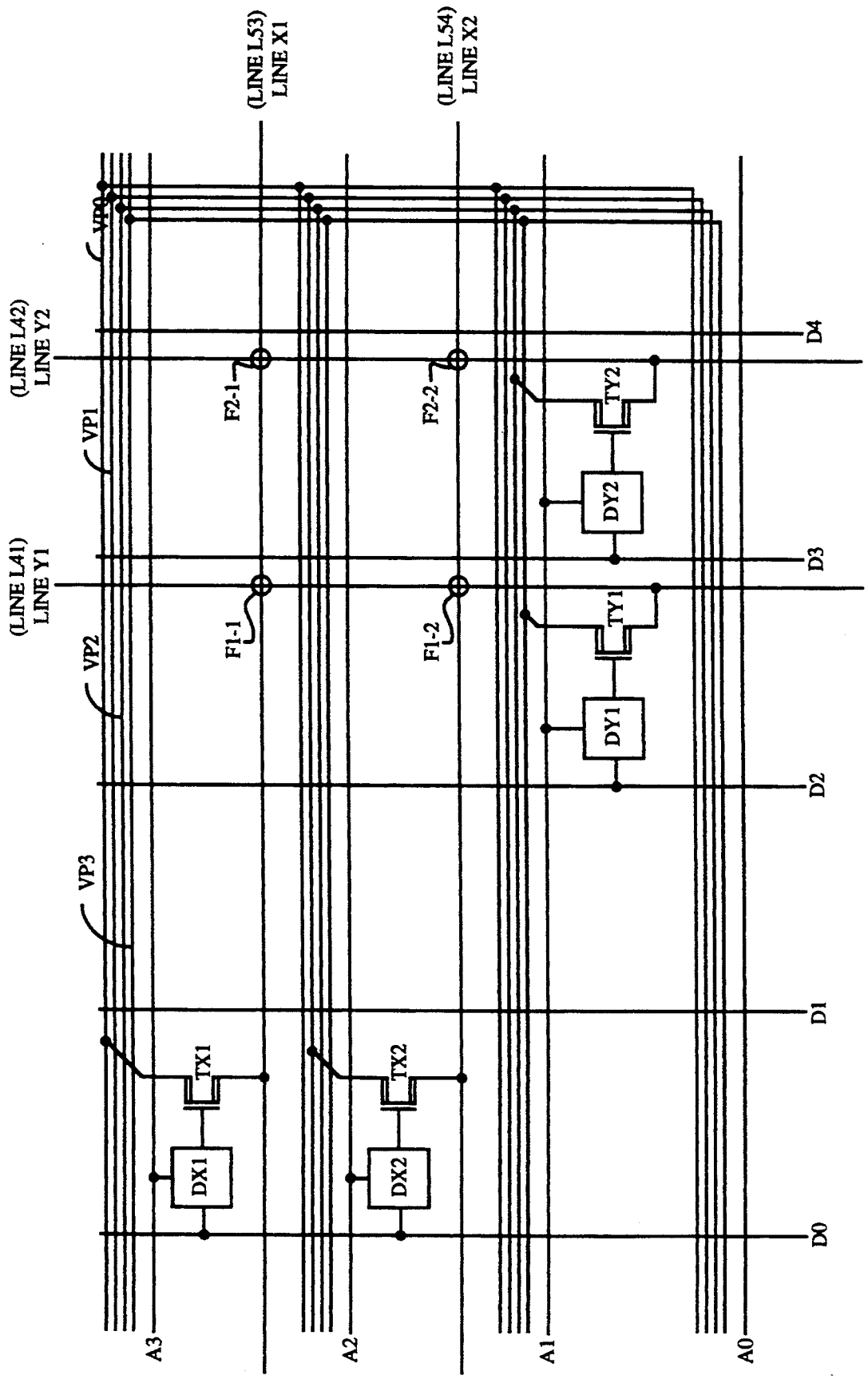

FIG. 7c shows an embodiment of the pumped decoder and horizontal address lines A0 through A3 are shown. Each pumped decoder is addressed by one vertical line and one horizontal line. Also shown in FIG. 7c are four interconnect line segments, horizontal interconnect line segments X1 and X2 and vertical interconnect line segments Y1 and Y2. At the intersections of these horizontal and vertical line segments are four antifuses F1-1, F1-2, F2-1 and F2-2. Pumped decoder DX1, when addressed by address lines A3 and D0, causes transistor TX1 to turn on and connect programming line VP0 to interconnect line segment X1. Pumped decoder DX2, when addressed by address lines A2 and D0, causes transistor TX2 to turn on and connect programming line VP1 to interconnect line segment X2. Pumped decoder DY1, when addressed by address lines A1 and D2, causes transistor TY1 to turn on and connect programming line VP3 to interconnect line segment Y1. Pumped decoder DY2, when addressed by address lines A1 and D3, causes transistor TY2 to turn on and connect programming line VP2 to interconnect line segment Y2. To program antifuse F1-1, transistors TXI and TY1 are turned on by applying high signals on address lines A3, D0, A1, and D2, and while these two transistors are on, applying sufficiently different programming voltages (typically 15 to 18 volts) to programming lines VP3 and VP0. From this description it can be seen how the other four antifuses of FIG. 7c are programmed, and indeed how antifuses in a larger array are programmed.

Sequential Addressing and High Capacitance Decoders

Figure 7D:
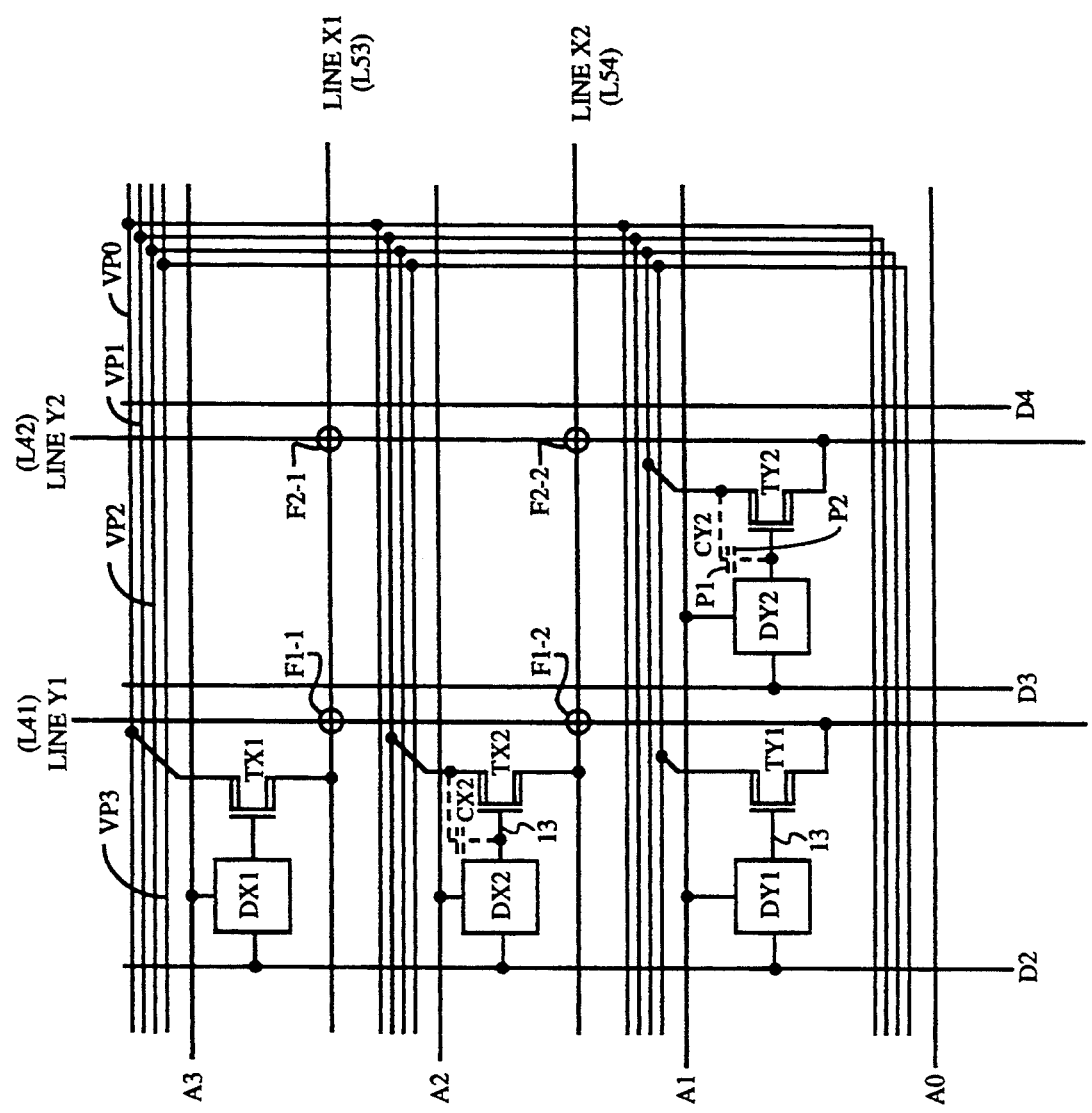

FIG. 7d shows an embodiment of the invention in which another novel and useful feature is employed. Again, assume antifuse F2-2 is to be programmed. In FIG. 7d, just as in FIG. 7c, transistors TX2 and TY2 must be turned on to program antifuse F2-2. In both FIG. 7c and FIG. 7d, transistors TX2 and TY2 are turned on by addressing lines D2, A2, (for TX2) and A1, D3 (for transistor TY2).

FIG. 7c, however, shows a sparse array in which these four lines may be simultaneously addressed without also turning on any additional transistors. However, with the array of FIG. 7d, if the four lines D2, A2, A1, and D3 are addressed simultaneously, the transistors for programming antifuse F1-2 are also turned on. The combination of lines A1 and D2 turns on transistor TY1 in addition to the desired result that the combination of lines A2 and D2 turns on transistor TX2.

It is desirable to be able to use a compact array such as shown in FIG. 7d in order to reduce silicon area. A novel feature of the present invention allows antifuses in such a compact array to be programmed without the above ambiguity.

Sequential Addressing of Antifuse Terminals

Figure 10:
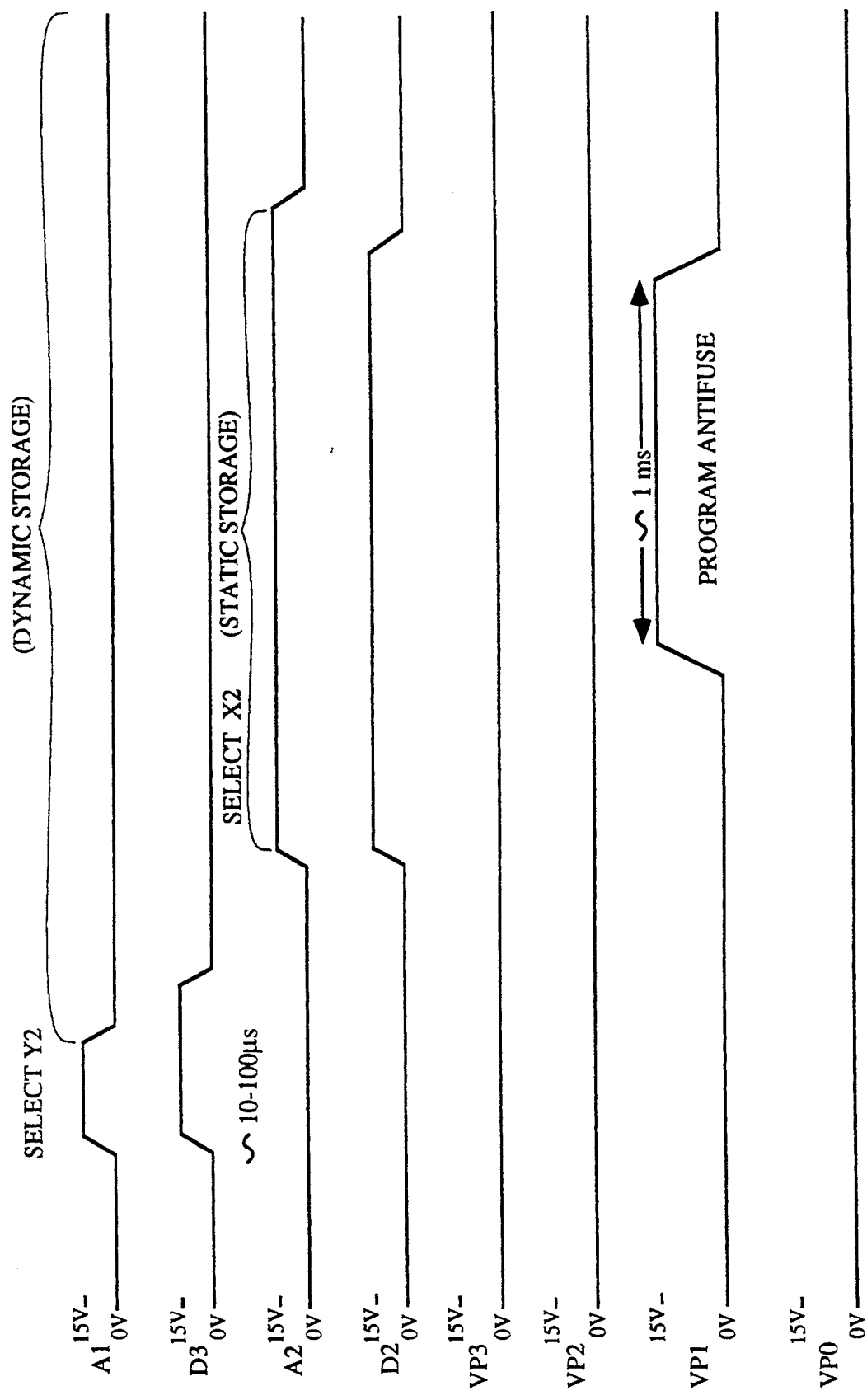
FIG. 10 shows timing for programming an antifuse in the circuit of FIG. 7d.

Instead of activating all four addresses of the two line segments simultaneously, the line segments are addressed in pairs sequentially, and the capacitance of the decoder circuit used to hold the first addressed programming transistor on until the second transistor has been addressed and the antifuse programmed. There is no possibility of addressing multiple antifuses, as occurs when simultaneous addresses on address lines A1 and D2 cause the programming of antifuse F1-2 (discussed above). With the sequential addressing of the present invention, as can be seen in FIG. 10, when antifuse F2-2 is to be programmed, address lines A1 and D2 are never addressed simultaneously, so decoder DY1 never turns on transistor TY1 to apply a programming voltage across antifuse F1-2.

Programming of an antifuse requires only on the order of one millisecond between the time programming voltages are applied to lines in the programming bus and antifuse programming is completed to achieve a typical resistance on the order of 100 ohms. Yet programming transistors held on by their corresponding pumped decoders for a time on the order of 10 ms after the corresponding address and data lines are no longer addressed. Thus sequential addressing of two programming transistors can be used to cause only the desired transistors to be turned on so that only the desired antifuse is programmed.

Timing for Sequential Addressing

For programming antifuse F2-2, assume that a high voltage will be applied to interconnect line segment X2 and a low voltage will be applied to interconnect line segment Y2. The timing sequence for this programming is shown in FIG. 10. Reference numerals in FIG. 10 have the same meaning as those in FIG. 7d. The decoder for the line segment to which the low voltage will be applied is preferably addressed first, and for a sufficient number of clock cycles to pump the decoder output node to its output voltage. In this case decoder DY2 for applying the low voltage to line segment Y2 is addressed by applying logical one (5 volt) voltages to address lines A1 and D3. These logical one address voltages are applied for a duration of less than one ms, causing the pumped decoder to turn on transistor TY2 and thereby select lie segment Y2. As shown in FIG. 10, this takes on the order of 10 to 100 microseconds. Address lines A1 and D3 are then deselected by placing logical zero first on line A1 and then on line D3. (see FIG. 6b) The logical zero on line A1 turns off transistor T5 and disables clock $\phi$A1, thereby isolating node 13 and retaining charge on the gate of transistor T52.

Next, the decoder for the line segment to which the high voltage will be applied is addressed. In this case, decoder DX2 for line segment X2 is addressed by applying logical 1 voltages to lines A2 and D3. This causes pumped decoder DX2 (preferably of the type shown in FIG. 6b) to raise the gate voltage on transistor TX2 to one threshold voltage above the voltages on the Vpp line, turning on transistor TX2 and selecting line segment X2. While line segment X2 is addressed, the high and low programming voltages are applied to the respective lines of the programming bus. That is, a high voltage (15 to 18 volts) is applied through programming bus line VP1 to line segment X2 while zero volt levels are applied to programming bus lines VP0, VP2, and VP3. The zero volt level on VP2 is transferred by transistor TY2 to line Y2, so that the programming voltage appears across antifuse F2-2.

Initially, the full programming voltage appears across the antifuse to be programmed, in this case antifuse F2-2. As programming occurs, the resistance of the antifuse drops, current through the antifuse increases, and the voltage difference across the antifuse decreases.

When programming is complete, the programming voltage is removed from the programming bus, and addressing voltages are removed from the second pair of address lines. Completion of programming may be established by a set time interval, by achieving an established programming current, or by removing the programming voltage and applying a voltage for measuring on-resistance (discussed earlier).

Benefit of First Addressing Low Voltage Line Segment

The reason the pumped decoder addressed first is preferably that decoder used to apply the low voltage to the antifuse, is that parasitic capacitance will tend to hold the corresponding programming transistor on after pumping ceases. Take the example shown in FIG. 7d of programming antifuse F2-2 with a high voltage to line segment X2 and a low voltage to line segment Y2. As current begins to flow through antifuse F2-2, the voltage on line segment Y2 approaches about 7 volts while the voltage on line segment X2 approaches about 8–9 volts. The voltage on plate P1 of parasitic capacitor CY2 will rise as antifuse F2-2 begins to conduct. The rising voltage on plate P1 induces a rising voltage on plate P2 of parasitic capacitor CY2. This rising voltage tends to hold transistor TY2 on during the full programming cycle even though pumped decoder DY2 is not being pumped when antifuse F2-2 is being programmed. During the one to two milliseconds in which this process takes place, the voltage on the gate of transistor TX2 is pulled down by the Miller capacitance of intrinsic capacitor CX2. But this effect is overcome by the current source from pumped decoder DX2 which is still addressed.

With the sequential addressing of the present invention, there is no possibility of an ambiguous programming address, as was discussed above in which simultaneous addresses on address lines A1 and D2 could cause the programming of antifuse F1-2, because as can be seen in FIG. 10, when programming antifuse F2-2, address lines A1 and D2 are never addressed simultaneously, so decoder DY1 never turns on transistor TY1 to apply a programming voltage across antifuse F1-2.

Global Clear Between Programming of Successive Antifuses

After programming an antifuse, in order to assure that no programming transistors are inadvertently addressed while the address is being moved from one transistor to another, the programming transistors turn off during a global clear operation (all address lines A0–An of an array such as shown in FIG. 7d are brought high and data lines D0–Dm are brought low during a transition period), after which time the next antifuse may be programmed.

Testing

Another benefit of the circuit of the present invention is that testing of logic devices and interconnect lines (i.e., the programming logic circuitry) can be performed using the programming bus and address lines, with no requirement for additional testing circuitry. As can be seen in FIGS. 6a and 6b and also in overview FIG. 7a, certain line segments extend to logic devices. Each logic device must be tested for proper performance before the device is shipped. However, the chip must be able to be tested without programming any of the antifuses available to the user, in order to make the full programmability available to the customer who will use the chip. Since certain of the interconnect lines connect directly to a logic device and through a programming transistor to one of the programming voltage lines, it is possible to use these programming transistors and programming voltage lines to apply test vectors to the logic devices. Any node in the antifuse array may be tested by selectively turning on programming transistors. For example, in FIG. 6a, by applying a test voltage to programming line VP0, and turning on transistor T52, the test voltage may be applied to logic device CLEI without the need for programming an antifuse. Likewise, with the logic array of FIG. 7a, various test signals may be applied through various lines of the programming bus (not shown in FIG. 7a) to lines L51 through L54 by turning on appropriate programming transistors, thereby providing test signals to logic device 9-5.

Test Modes

Three modes of testing can be performed using the structure of the present invention, as shown in FIG. 6b, for example.

A first testing mode, called row mode, can apply logic signals to all interconnects and/or logic device inputs addressed by a particular row of address lines A1 through An in the array. In row mode, described in the summary above, the weak (resistive) pull-up transistors such as T6 are turned on by applying a logical one to nodes 16 and 17. Next, transistor T52 is selectively turned on by applying logical one to lines A1 and D1, which turns on transistor T5, and brings node 13 to roughly 4 volts. Given that VP0 through VP3 are all held at zero volts, the 4 volt level on node 13 is sufficient to hold transistor T52 on and apply a logical zero to node 9 in spite of the weak pull-up from transistor T6. During such test operations, the pump portion of pumped decoder D52 is not used.

Node 9 of FIG. 6b is connected to an interconnect line segment such as segments X1, X2, Y1, or Y2 of FIGS. 7c and 7d or segments L1 through L54 of FIG. 7a. By turning on an array of pull-up transistors such as transistor T6 of FIG. 6b, then simultaneously turning on a selected set of programming transistors such as T0 of FIG. 6b (or TX1, TX2, TY1, or TY2 of FIG. 7c and 7d) and thereby applying pull-down voltages to certain programming possible to control through the addressing structure (including lines A0 through A3 and D0 through D4 of FIG. 7c and 7d) which terminals of the logic devices receive high and low input signals, thus providing test vectors, without the need for separate testing lines for each input terminal of a logic device. This set of resistive pull-up transistors such as T6 provides pull-up voltages to lines not interconnected in the programmed logic array, and therefore serves the double purpose of preventing floating lines during circuit operation and providing a voltage source during testing. Row mode allows loading of many address or data lines in parallel so as to apply test vectors to a number of nodes simultaneously.

In a second mode, called direct input drive mode, node 13 is brought to 4 volts, as above. However, the test signal is placed directly on VP0 and this signal then drives the logic device input at node 9 directly through transistor T52. In this mode transistor T6 can be turned off. By applying 5 volts to Vpp, the pumped decoder D52 can be used to raise the voltage at node 13 to approximately 6 volts, thereby allowing the full rail to rail signal on programming line VP0 to be applied to the logic device input at node 9. This mode can be used when a single input needs to be driven at high speed.

In a third test mode, used for testing logic device output signals, node 9 is an output node from a logic device. In this mode, voltages at A1, D1, 16 and 17 are the same as in the second mode. However, line VP0 is used for detecting the signal applied by the logic device to node 9.

Output of the logic devices on output line segments L55 and L56 of logic device 9-5 (FIG. 7a) may be detected by turning on appropriate programming transistors directly connected to output line segments L55 and L56 of logic device 9-5. In order to avoid programming any antifuses during testing, the test voltages are typically 0 to 5 volts, much lower than the programming voltage of 15 to 18 volts which will program an antifuse.

Also preferably provided, though not specifically shown in FIG. 6b, are antifuses which allow line segments to be connected to high or low source voltages. This option allows a constant high or constant low voltage to be applied to any input terminal of a logic device not used for a particular logic function, so that terminal is not left floating.

Though only specific embodiments of the present invention have been described here in detail, other embodiments will become obvious to those skilled in the art in light of the above description, and are intended to fall within the scope of the present invention.

We claim:

1. A structure for programming an array of antifuses in an integrated circuit structure comprising:
   a set of programming voltage lines to which programming voltages can be applied;
   a plurality of antifuses;
   a plurality of interconnect line segments, each connected to one terminal of at least one of said antifuses; and
   means for selectively connecting each of said interconnect line segments to one of said programming voltage lines and applying a known voltage difference across each of said antifuses regardless of the states of other antifuses.

2. A structure for programming an array of antifuses in an integrated circuit structure as in claim 1 in which said means for selectively connecting each of said interconnect line segments to one of said programming voltage lines comprises, for each of said interconnect line segments:
   a programming voltage transistor having a first current carrying terminal connected to said line segment, a second current carrying terminal connected to one of said programming voltage lines, and a control terminal connected to means for turning on said programming voltage transistor.

3. A structure for programming an array of antifuses in an integrated circuit structure as in claim 2 in which said means for turning on said programming voltage transistor comprises;
   a pumped decoder, said pumped decoder providing an output voltage sufficient to turn on said programming voltage transistor in response to being addressed with voltages not sufficient to program said antifuses.

4. A structure for programming an array of antifuses in an integrated circuit structure as in claim 3 in which said programming voltage transistor is an NMOS transistor and said pumped decoder provides to said control terminal of said programming voltage transistor a turn-on voltage of magnitude higher than a magnitude of said programming voltages.

5. A structure for programming an array of antifuses in an integrated circuit structure as in claim 1 in which some of said interconnect line segments connect to logic devices in said integrated circuit structure, whereby said programming voltage lines can be used for testing said logic devices without need for programming said antifuses.

6. The structure of claim 1, further comprising means for testing the structure.

7. The structure of claim 6, wherein the means for testing includes resistive means connected between the means for selectively connecting and a supply voltage.

8. A structure for programming an array of antifuses comprising:
   a set of programming voltage lines to which programming voltages can be applied;
   a plurality of antifuses;
   connecting means for connecting a different one of the programming voltage lines to each terminal of an antifuse; and
   pumping means connected to each of the connecting means for causing the programming voltages to be applied to the terminals of the antifuse.

9. A method for programming an antifuse in an integrated circuit structure comprising the steps of:
   addressing an interconnect line attached to a first terminal of said antifuse, thereby causing said first terminal to be connected to a first programming voltage line;
   addressing an interconnect line attached to a second terminal of said antifuse, thereby causing said second terminal to be connected to a second programming voltage line;
   simultaneously applying a first programming voltage to said first programming voltage line and a second programming voltage to said second programming voltage line, thereby causing said antifuse to become permanently conductive.

10. A method for programming an antifuse in an integrated circuit structure as in claim 9 in which said steps of addressing said interconnect lines attached to said first and second terminals of said antifuse are performed sequentially such that a time at which said first interconnect line is addressed does not overlap with a time at which said second interconnect line is addressed.

11. A method for programming an antifuse in an integrated circuit structure as in claim 9 in which:
    said step of addressing an interconnect line attached to a first terminal of said antifuse comprises applying addressing voltages to horizontal and vertical address lines connected to a first decoder which turns on a transistor which connects said interconnect line to said first programming voltage line; and
    said step of addressing an interconnect line attached to a second terminal of said antifuse comprises applying addressing voltages to horizontal and vertical address lines connected to a second decoder which turns on a transistor which connects said interconnect line to said second programming voltage line.

12. A method for programming an antifuse in an integrated circuit structure as in claim 11 in which said transistors are NMOS transistors and said first NMOS transistor has a capacitance sufficient to remain turned on after no longer being addressed for said first programming voltage to be applied to said first interconnect line.

13. A method for programming an antifuse in an integrated circuit structure as in claim 12 in which said step of applying addressing voltages to said first decoder is performed before said step of applying addressing voltages to said second decoder.

14. A method for programming an antifuse as in claim 13 in which said first programming voltage applied to said first programming line is a lower voltage than said second programming voltage applied to said second programming line.

15. In an integrated circuit structure in which antifuses may connect interconnect line segments to a logic device through direct connect line segments connected directly to said logic device and in which programming voltages may be applied through programming voltage lines to said interconnect line segments for programming said antifuses, a method for testing said logic device without programming said antifuses comprising the steps of:

causing some of said direct connect line segments connected to said logic device to be connected to corresponding programming voltage lines; and applying test voltages to at least one of said programming voltage lines and observing voltages placed by said logic device on at least one of said programming voltage lines.

16. A method for testing as in claim 15 further comprising the step of connecting at least some of said direct connect line segments to a supply voltage source.

17. A method for determining programmed resistance of an antifuse in a structure having a plurality of antifuses each positioned between a pair of programming transistors, each pair of programming transistors programmably connecting a corresponding antifuse between programming voltage sources, and at least one pair of measurement transistors formed to be like said programming transistors and connected in series between said programming voltage sources without an intervening antifuse, comprising the steps of: programming said antifuse;

applying a voltage difference between said programming voltage sources sufficiently low to cause said measurement transistors to operate in their linear range;

turning on said measurement transistors;

measuring current through said measurement transistors and calculating resistance of said measurement transistors;

turning on programming transistors connecting said antifuse to said programming voltage sources;

measuring current through said programming transistors and said antifuse; and calculating resistance of said antifuse assuming said programming transistors have resistance equal to that of said measurement transistors.

18. A structure for measuring resistance in a programmed antifuse in an array of antifuses in an integrated circuit structure comprising:

a set of programming voltage lines to which programming voltage can be applied;

a plurality of antifuses;

for each antifuse a first programming voltage transistor for programmably connecting a first terminal of said antifuse to a first one of said programming voltage lines, and a second programming voltage transistor for programmably connecting a second terminal of said antifuse to a second one of said programming voltage lines;

at least one pair of measurement transistors connected in series between two of said programming voltage lines, said measurement transistors being manufactured to have the same resistance characteristics as said programming transistors;

whereby resistance of said measurement transistors can be measured and used as a reliable estimate of resistance of said programming transistors.

* * * * *

UNITED STATES PATENT AND TRADEMARK OFFICE
CERTIFICATE OF CORRECTION

PATENT NO. : 5,367,207　　　　　　　　　　　　Page 1 of 10

DATED : November 22, 1994

INVENTOR(S) : Goetting et al.

It is certified that error appears in the above-identified patent and that said Letters Patent is hereby corrected as shown below:

On the title page, under the Abstract, "13 Drawing Sheets" should be --14 Drawing Sheet--.

Add the Drawing Sheet, consisting of Fig. 8C, as shown below.

Delete columns 1-18, and substitute columns 1-18.

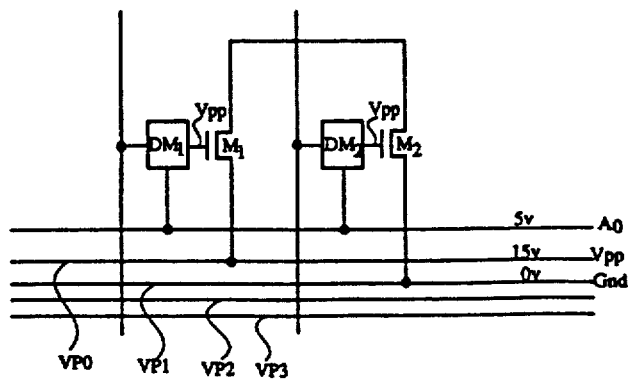

FIGURE 8C

Signed and Sealed this

Eleventh Day of February, 1997

Attest:

BRUCE LEHMAN

Attesting Officer　　　　Commissioner of Patents and Trademarks

STRUCTURE AND METHOD FOR PROGRAMMING ANTIFUSES IN AN INTEGRATED CIRCUIT ARRAY

RELATED APPLICATION

This application relates to commonly assigned co-pending application Ser. No. 07/622,695 filed Dec. 4, 1990, entitled "STRUCTURE AND METHOD FOR TESTING ANTIFUSE RESISTANCE AND CIRCUIT SPEED", invented by David B. Parlour and F. Erich Goetting, incorporated herein by reference.

FIELD OF THE INVENTION

This invention relates to the programming of programmable integrated circuit structures, in particular to the shorting of antifuses to connect elements in an array of logic elements.

BACKGROUND OF THE INVENTION

Elements for programming PROM's, EEPROM's and logic arrays have included fuses and transistors. It is also possible to make programmable connections using shortable elements (antifuses). An antifuse is an element which before programming has a high impedance and which upon application of an appropriate voltage changes to a low impedance conductive state. A thin dielectric, such as silicon dioxide between two conductive regions, such as aluminum, can serve as an antifuse, programmable by the current and local high heat which occur when sufficient voltage is applied to cause current to flow through the dielectric.

Figure 1:
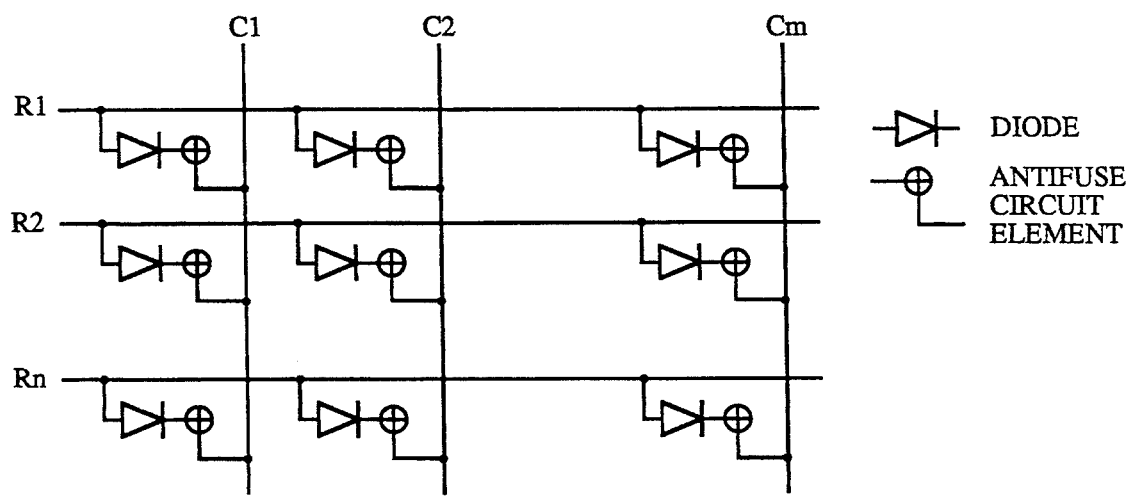
FIGS. 1-5 show prior art antifuse circuitry.
Figure 2:
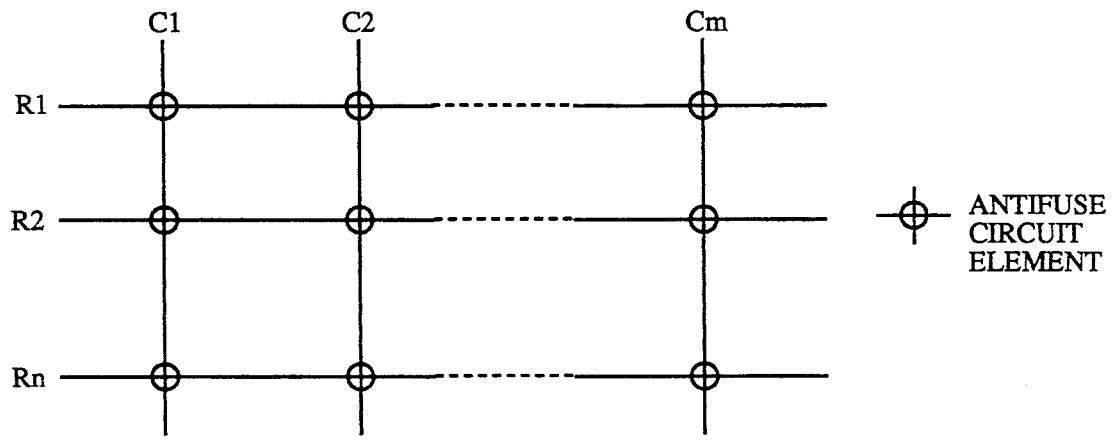

Two common programmable arrays are shown in FIGS. 1 and 2. In FIG. 1, horizontal row lines R1 through Rn are connected to vertical column lines C1 through Cm through interconnects each comprising a diode and a programmable connector. The programmable connectors of FIG. 1 are antifuses, although fuses are also commonly used in this application. The diodes and antifuses of FIG. 1 are identified by the row and column which they connect. Thus the diode and antifuse which connect row R2 to column C1 are diode R2,C1 and antifuse R2,C1. To program the array of FIG. 1 so that row R2 is connected to column C1, all columns except C1 are brought to a high voltage and all rows except R2 are brought to a low voltage. Row R2 is brought to a high voltage and column C1 is brought to a low voltage. This combination of voltages causes diodes at intersections not including row R1 or Column C1 to be back biased. There is no voltage drop at intersections of column C1 with rows other than R2 and there is no voltage difference at intersections of row R2 with columns other than C1. However, diode R2,C1 is forward biased so that the full voltage difference is experienced by antifuse R2,C1. If the voltage levels are sufficient to program the particular antifuse, antifuse R2,C1 will short out and form a permanent connection between row R2 and column C1 through diode R2,C1. This technique works well for memory arrays. However, the diodes prevent two-way flow of current and thus the above method may be unacceptable for certain programmable logic applications where bidirectional current flow is required.

A second technique, shown in FIG. 2, eliminates the use of diodes, using simply cross point switch connections, and relies on the use of three voltage levels for selecting the intersection to be connected. As shown in FIG. 2, columns C1 through Cm can be connected to rows R1 through Rn by connecting antifuses at the appropriate intersections. An antifuse is indicated by a ⊕ at the intersection. As with FIG. 1, the antifuses will be identified by the rows and columns which they connect.

In order to connect column C1 to row R2, all rows and columns except C1 and R2 are brought to an intermediate voltage level. Column C1 is brought to a high voltage level and row R2 is brought to a low voltage level. With this combination, antifuses at intersections not including row R2 or column C1 experience no voltage difference. Antifuses connecting rows except R2 to column C1 experience the voltage difference between the high and intermediate levels. Antifuses connecting columns except C1 to row R2 experience the voltage difference between the intermediate and low levels. If the intermediate voltage level is half way between the high and low voltage levels, the voltage difference experienced by antifuse R2,C1 is twice that of other elements in row R2 or column C1. If the antifuses can be reliably manufactured such that the voltage difference between the high and low voltages is sufficient to short the element and the voltage rise or difference between intermediate and the high or low voltages is not sufficient to short the element, this technique can be used to program an array of connections without having diodes in the signal path, in contrast to the array of FIG. 1.

Note, however, that after programming the first connection, for example R2,C1, row R2 and column C1 can no longer be brought to different voltage levels for future programming. If it is next desirable to connect row R2 to column Cm, both row R2 and column C1 will be brought to a low level, other columns except for columns C1 and Cm will be brought to an intermediate level, and column Cm will be brought to a high level. Thus in order to place the programming voltage on element R2,Cm, half the programming voltage must be placed across all elements in row R2, column Cm and also column C1, except of course for element R2,C1 which is already programmed.

If it is next desirable to connect element Rn,C1 row Rn will be brought low. Column C1 will be brought high thus placing high voltages on row R2 and column Cm which have been previously connected. But this action places a programming voltage not only on element Rn,C1 which is to be programmed but also on element Rn,Cm which is not intended to be programmed.

Figure 3:
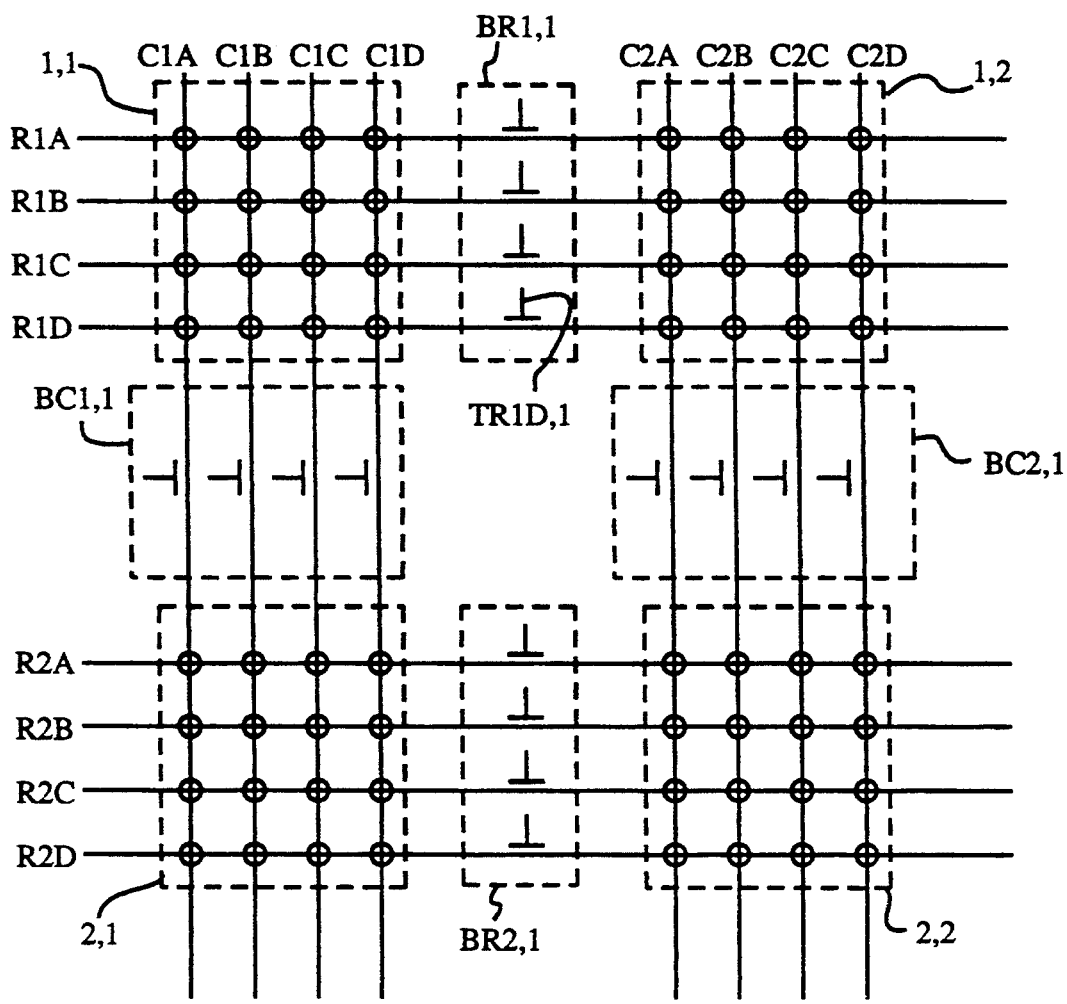

Structures such as shown in FIG. 1 are preferred for memories, where isolation of elements is provided by the diodes, and where it is not necessary to have bidirectional current flow. Structures such as shown in FIG. 2 are preferred for interconnect lines where bidirectionality is important and lack of isolation can be dealt with. FIG. 3 shows a structure in which isolation is not provided by diodes but is accomplished by dividing the entire array into smaller units for isolation. When the structure of FIG. 3 is to be programmed, transistors in units BR1,1 and BC1,1 can be turned off while programming the antifuses of section 1,1, thus avoiding the possible erroneous programming which would occur if the entire array were interconnected. Similarly, other sections can be isolated for antifuse programming. For operation of the device in which the antifuse array of FIG. 3 is located, isolating transistors such as those in BR1,1 and BC1,1 are turned on so that the array is interconnected as desired.

Figure 4:
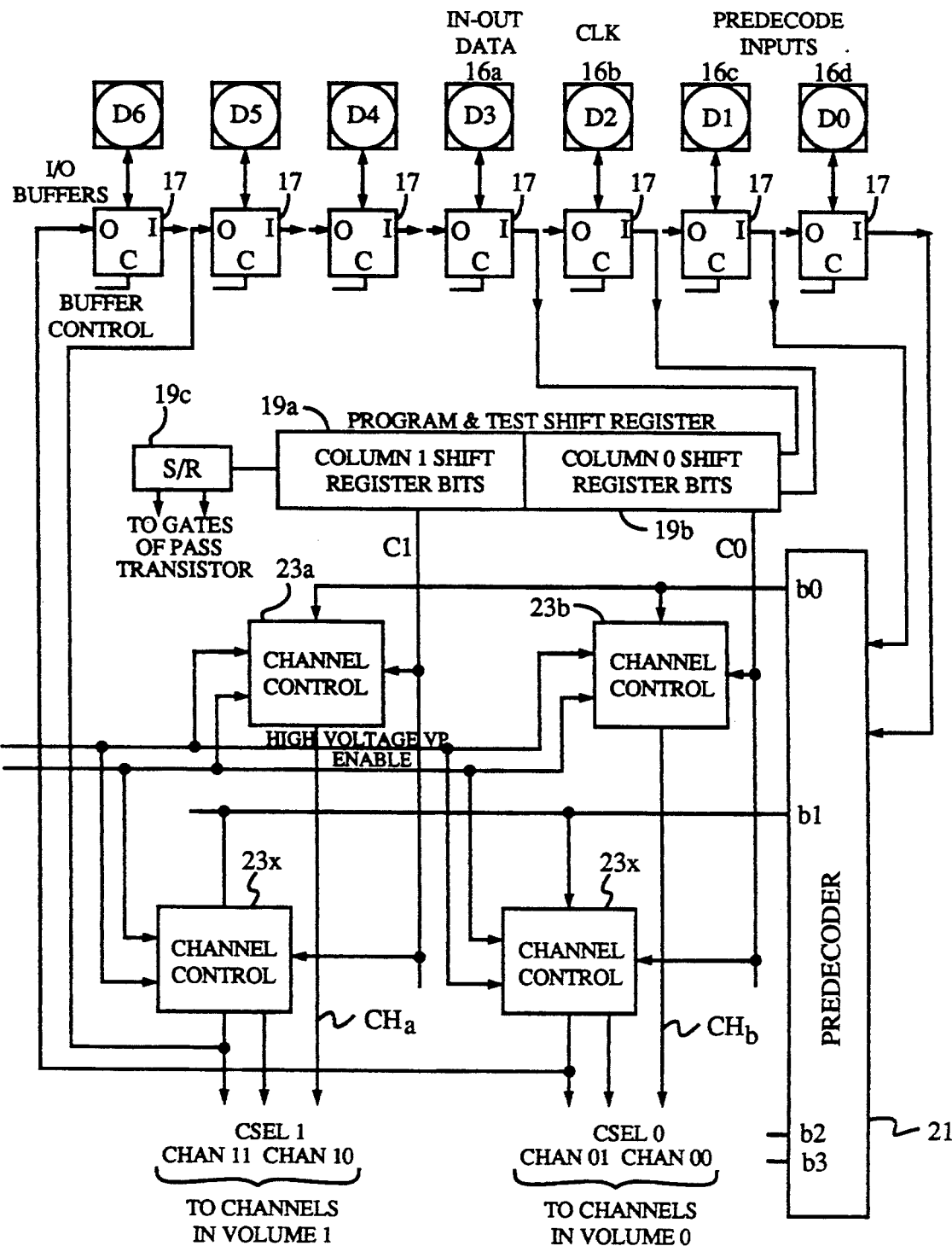
Figure 5:
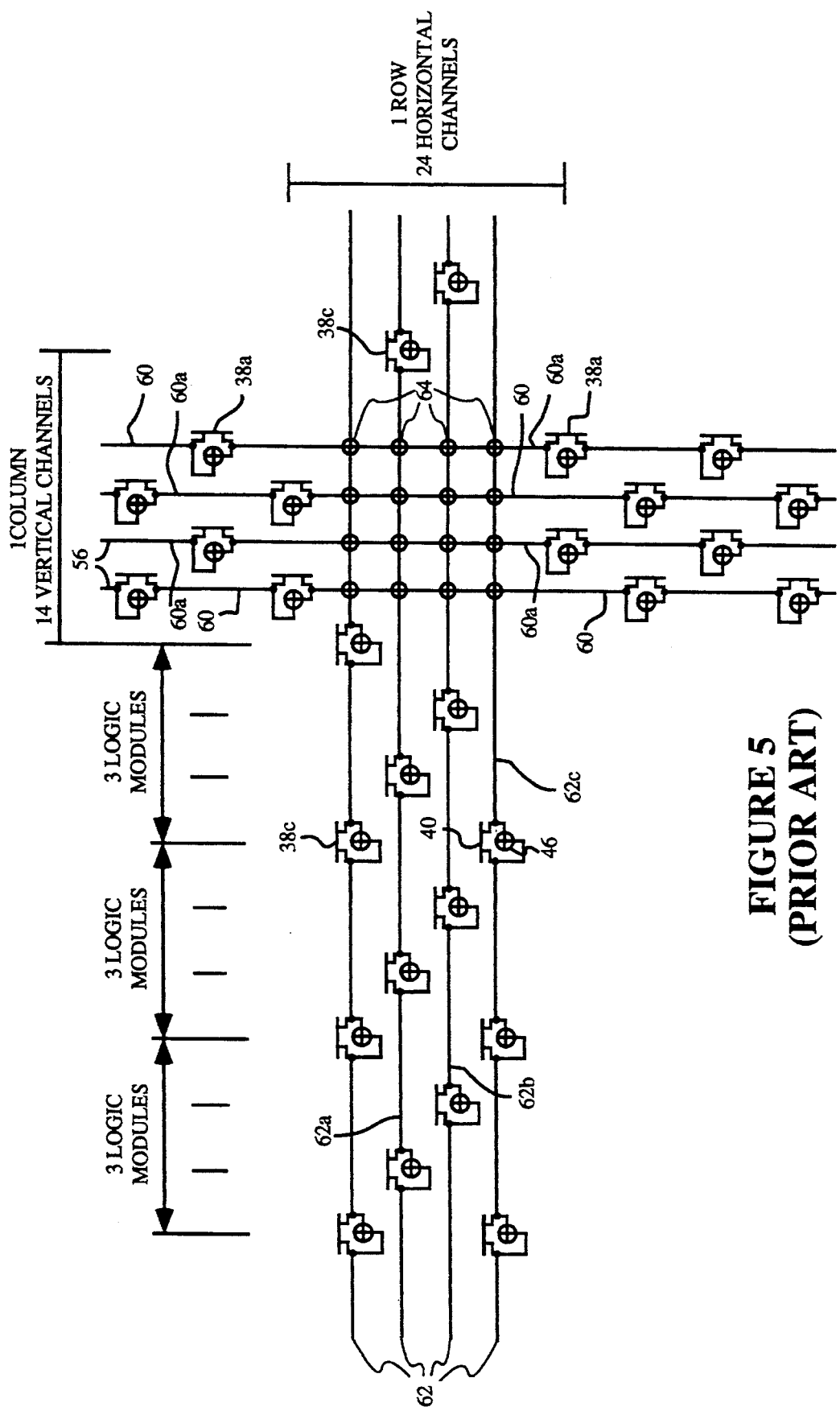

Further structures and methods for programming antifuses are known. Elgamal et al., in U.S. Pat. No. 4,758,745 describes a structure and method for programming antifuses which, as shown in FIG. 4 (Elgamal FIG. 1B), uses one channel control logic unit 23 for controlling the voltage to be applied to each line in an array. As shown in FIG. 5, (Elgamal FIG. 5, which is described in Elgamal col. 8, starting at line 53), pass transistors 40 are provided in parallel with programmable elements (antifuses) 46. Pass transistors 40 are used as feed through transistors during programming of one of the programmable elements 46. By turning on all transistors in a horizontal channel except the transistor for which an antifuse is to be programmed, a programming voltage can be applied to that antifuse. For example by turning on all transistors in channel 62c except transistor 40, and applying low and high voltages to opposite ends of the channel 62c, it is possible to generate enough voltage across terminals of antifuse 46 to program antifuse 46. Because the programming voltage must be applied through a series of transistors such as transistor 40, the programming current for programming antifuse 46 will be limited by the resistance of the transistors in channel 62c through which the current must flow. Since final resistance of the programmed antifuse depends upon current during programming, the final antifuse resistance is also limited by the resistance of transistors in channel 62c. Further, the arrangement of FIG. 5 is not easily scaled. Since the resistance of a channel such as 62c depends upon the number of transistors in series, if one were to design a set of devices using the principles of FIG. 5, it would be necessary to use different design rules for each device having a different number of transistors in series. If decoders were added midway when scaling to a larger device, so that a programming current was applied through only a set number of transistors in series, the efficiency of having decoding performed entirely at the periphery of the chip would be lost.

Finally, depending upon the number of antifuses to be programmed in one channel and the order in which they are programmed, the final antifuse resistance can vary considerably.

SUMMARY OF THE INVENTION

According to the present invention, a structure and method are provided which allow a programming voltage to be applied to interconnect line segments using only a single transistor between the programming voltage source and the interconnect line segment, such that the programming current flows through only two programming transistors between the two programming voltage sources. In addition, the structure of the present invention allows both programming and testing to be performed with one structure, so that no separate overhead structure is required for testing. No change in design rules is needed when the number of antifuses in an integrated circuit chip is scaled up or down. Further the resistance of a programmed antifuse is both predictable and small.

Another feature allows antifuses which require a high programming voltage to be used on the same chip with SRAM circuitry which preferably is too small to tolerate a voltage high enough to program an antifuse.

With the present invention, the logic for decoding the addresses of two interconnect line segments to be connected through an antifuse simply turns on pass transistors, which causes the particular interconnect line segments to be connected to the programming voltage supply lines. Logic needs to be provided only once for the entire chip in order to select voltages to be applied to the programming voltage supply lines.

According to another novel feature of the present invention, the number of lines in the addressing structure needed to address all interconnect line segments in an array can be reduced by taking advantage of the capacitance of a decoder circuit. The decoders which turn on transistors for applying programming voltage to the line segments connected to two terminals of an antifuse are addressed sequentially rather than simultaneously, although the programming voltages are applied simultaneously. The capacitance of the decoders is sufficient to hold these transistors on for a short time after they are no longer addressed. During this short time when one transistor has been turned on and its line segment has been connected to a programming voltage source, the decoder for the other line segment to be connected is addressed and programming voltages are applied to the two line segments, thereby programming the antifuse connected to the two addressed line segments. Addressing only one decoder at one time avoids erroneously addressing an unintended decoder.

Further, with the present invention, the polarity of the programming voltage can be determined by the programming hardware at the time the chip is programmed, and is not limited by the circuitry. Indeed the programming hardware may be programmed to apply a programming voltage sequentially in both polarities in order to further reduce resistance of the programmed antifuse. With many antifuse technologies, it is preferred to apply the programming voltage in a particular direction. According to the present invention, it is possible in all cases to apply the voltage in either or both directions and yet this choice is achieved with no more silicon area than required for a single direction.

In a preferred embodiment of the present invention, all programming transistors are made with NMOS technology. This simplifies the manufacturing process, allows adjacent transistors to be more closely packed, and therefore allows the entire chip to be more dense.

An advantage of the present invention is that, conceptually, each antifuse is arranged between a parallel pair of programming lines, one programming transistor connecting the antifuse to each of the programming lines. The programming lines each pass through the entire chip. Thus an antifuse may be accessed through only two programming transistors no matter how large the array.

The structure of the present invention allows for testing of logic devices which are part of the integrated circuit structure and which are to be interconnected by an end user. Testing is performed using the programming lines for applying test vectors and observing results. Test signals are applied through a combination of programming transistors and resistive pull-up transistors. The pull-up transistors are already included in the circuit to apply intermediate voltages required during programming. These intermediate voltages are used as discussed in connection with FIG. 2. For testing, logical high test signals are applied through the pull-up transistors and logical low test signals are applied through programming voltage lines. This allows all possible combinations of high and low signals to be applied to the logic devices without requiring additional test circuitry, and, of course, without requiring that any antifuses be programmed.

As a further feature of the present invention, a pump-up circuit providing a high transistor gate voltage to programming transistors is controlled by a low voltage (typically 5 volt) signal also used for controlling low voltage memory cells.

BRIEF DESCRIPTION OF THE DRAWINGS

FIGS. 1–5 show prior art antifuse circuitry.

FIGS. 6a, 6b show programming circuitry in accordance with the invention.

FIGS. 7a, 7b, 7c, 7d show antifuse array circuitry in accordance with the invention.

FIGS. 8a and 8b show a comparison of the antifuse programming arrangement of a prior art structure to the antifuse programming arrangement of the present invention.

FIG. 8C shows a pair of measurement transistors used for determining programmed resistance of an antifuse.

FIG. 9 shows ranges of final resistance vs. programming current for an antifuse device.

FIG. 10 shows timing for programming an antifuse in the circuit of FIG. 7d.

DETAILED DESCRIPTION OF A PREFERRED EMBODIMENT

Antifuse Programming through Programming Bus with Fixed Connections to Line Segments FIG. 6a shows antifuse F1 at the intersection of two interconnect line segments S51 and S52. The antifuse is programmed by providing sufficiently different voltages to line segments S51 and S52 which in turn contact the two terminals of antifuse F1. In an array in which the invention is advantageously used, comprising line segments, logic devices, and antifuses for interconnecting line segments, a programming voltage can be applied to each interconnect line segment of the array through a pass transistor. According to the invention, one programming pass transistor is provided for each interconnect line segment. (More than one antifuse may be and usually is connected to one line segment, as will be discussed in connection with FIG. 7a.) A programming bus to which programming voltages can be applied extends through the array, with each line segment in the array being connectable through its pass transistor to one line of the programming bus. In order to program an antifuse the two terminals of the antifuse must be connected to line segments which connect to different lines of the programming bus.

As shown in FIG. 6a, line segment S51 is connected through transistor T51 to programming voltage line VP1. Line segment S52 is connected through transistor T52 to programming voltage line VP0. FIG. 6a shows four programming voltage lines VP0, VP1, VP2, and VP3 in the programming bus. The antifuse is programmed by applying sufficiently different voltages to the two lines of the programming bus which are connected through programming transistors and corresponding line segments to the two terminals of the antifuse, and turning on the programming transistors while the voltages are applied to those programming bus lines. Any voltage can be applied to any programming bus line; therefore the direction of current flow through the antifuses such as F1 can be selected at the time of programming.

NMOS Technology and Pumped Decoder

In a preferred embodiment, all programming voltage transistors, such as T51 and T52, are NMOS transistors having fairly large current carrying ability (typically 20 ma). Using only NMOS transistors has at least three advantages over using mixed NMOS and PMOS transistors. NMOS transistors have about twice the conductivity of PMOS transistors, an important factor for the high current needed to program antifuses. Further, it is possible to pack adjacent transistors more closely when they are the same conductivity type and space is not needed to separate N-wells from P-wells. Finally, using only a single conductivity type (N or P) simplifies the manufacturing process.

The NMOS programming transistors are controlled by pumped decoders such as D51 and D52, which apply a gate voltage slightly higher than the programming voltage by means discussed below, in order to allow the full programming voltage and high current to be applied across the antifuse. A pumped decoder allows low voltage address and data signals to control programming of the antifuses by pumping up the low voltage signals to higher programming voltages.

In one embodiment, SRAM (static random access memory) cells for configuring the array are included on the same chip as is the antifuse array. The SRAM cells require low voltage (5 volt) address (row) and data (column) signals for loading the SRAM cells with configuration information at power-up. It is most efficient to use the same address and data lines which configure the SRAM cells to also control programming of the antifuses. Advantageously, this is possible with the present invention. The low voltage signals which control the SRAM cells also address pumped decoders which allow high programming voltages to be applied to antifuses.

As shown in FIG. 6b, pumped decoder D52 of FIG. 6a may be formed from transistors T2 through T5, transistor T2 having its source and drain commonly connected to act as a capacitor. Also shown in FIG. 6b are the elements shown in FIG. 6a. The structure shown in FIG. 6b is typically one element in an array of such structures, each structure being addressed by a different combination of address lines A0 through An to AN and data lines D0 through Dm to DM. An array having such structures is shown in FIG. 7a, and is discussed below.

Regarding the operation of the pumped decoder of FIG. 6b, a global clock signal $\phi$, typically switching between 0 and 5 volts at a frequency on the order of 10 MHz, is applied to AND gate G1. Global clock signal $\phi$ generates a row clock signal $\phi_{A1}$ when line A1 is at logical one. To allow the pumped decoder of FIG. 6b to pump up the voltage on node 13, both of lines A1 and D1 must be brought to a logical one voltage level (5 volts).

When both lines A1 and D1 are addressed, the voltage at node 13 is pumped up by clock signal $\phi_{A1}$ alternately pulling charge onto the gate of transistor T2, which is acting as plate P2 of a capacitor, and then moving charge to the gate of transistor T52.

The known pumped decoder circuit D52 of FIG. 6b will now be explained. When logical one (5 volt) signals are applied to address and data lines A1 and D1, transistor T5 charges node 13 to roughly 4 volts (one threshold voltage $V_t$ below the voltage on line D1; threshold voltage is the voltage difference between gate and source/drain of an MOS transistor needed to turn on the transistor). Assuming that φA1 is at logical zero, capacitor plate P2 will have charged to one $V_t$ below node 13 through transistor T4. In this quiescent state, current is not flowing through transistors T2 through T5, though these transistors may be on. Since A1 carries a logic one, as φ rises from 0 to 5 volts, φA1 follows φ, and rises from 0 to 5 volts. As row clock signal φA1 rises, the rising voltage induces a corresponding rise at node 12 through the capacitor formed by transistor T2. As node 12 rises above the threshold voltage of transistor T3, transistor T3 turns on and current flows from node 12 to node 13 (from plate P2 to the gate of transistor T52). During this time transistor T4 is off. When φ, and correspondingly, φA1 decrease from 5 volts to 0 volts, the capacitor formed by transistor T2 induces a decreasing voltage on node 12. When the voltage on node 12 approaches the voltage on node 13, transistor T3 turns off. When the voltage on node 12 decreases more than one $V_t$ below node 13, transistor T4 turns on, thereby transferring charge from Vpp to node 12. This completes a pumping cycle. Typically tens or hundreds of cycles are required to bring node 13 to its maximum high voltage level, typically 17-18 volts. The maximum voltage at node 13 is determined by Vpp and transistor T4. As the voltage at node 13 reaches one $V_t$ above Vpp, current no longer flows from node 12 to node 13 when transistor T3 is on, but instead flows back to Vpp when transistor T4 is on.

Assuming the threshold voltage of transistor T4 is the same as the threshold voltage of transistor T52, and the supply voltage Vpp is the same as the high programming voltage VP0, transistor T52 will allow the full voltage VP0 to be applied to node 9 for programming antifuse F1. Note that supply voltage Vpp is not necessarily the same as programming voltage VP0, since voltage VP0 may be low, and the high programming voltage may be applied to the other terminal of the antifuse.

After a node for addressing a transistor has been pumped up, two different options may occur. The charge may be held on the node for a period of time while the transistor for accessing the other terminal of the antifuse is addressed and turned on, or if the transistor for addressing the opposite terminal is already on, the node for addressing the transistor may be held high only long enough for the antifuse to be programmed. The node is then returned to a low voltage so that the transistor is turned off. Sequential addressing of opposite antifuse terminals is discussed below in connection with FIG. 7d. In any case, charge is held on node 13 until antifuse F1 has been programmed. The charge is held on node 13 (as discussed further below) by bringing line A1 low before bringing line D1 low. Node 13 is discharged by holding line A1 at 5 volts and bringing the global clock low while D1 is brought low. In response, node 13 discharges through transistor T5 to line D1.

Application of the Structure and Method of the Present Invention

FIG. 7a shows an array circuit in which the present invention advantageously operates. Additional description of configurable arrays and logic devices in which the present invention advantageously operates may be found in U.S. Pat. Nos. 4,870,302, and 4,706,216, incorporated herein by reference, and in "The Programmable Gate Array Data Book" ©1989, available from Xilinx, Inc., 2100 Logic Drive, San Jose, Calif. 95124, also incorporated herein by reference. As shown in FIG. 7a, a plurality of horizontal and vertical interconnect line segments L1 through L54 are positioned in an integrated circuit device with a plurality of logic devices 9-1 through 9-6. Each interconnect line segment L1 through L54 is connected through a programming transistor to a programming voltage line VP0 through VP4, as shown in FIG. 6b. For simplicity, only a few programming transistors, for example TL41, and their associated pumped decoders, for example DL41, are shown in FIG. 7a. Antifuses for interconnecting line segments L1 through L54 are positioned at many intersections of the line segments and are represented as ⊕.

Also included in the array of FIG. 7a are interconnection boxes J1 through J12. Within each of these interconnection boxes are interconnect means, preferably antifuses, for selectively interconnecting lines which extend into the boxes. FIG. 7b shows interconnection box J10, in which two lines enter from each of the compass directions N, S, E, and W. Antifuses allow each of these lines to be connected to each other line extending into the box except for the other line coming from the same direction. The twenty-four antifuses shown in FIG. 7b allow this choice.

Programming Bus and Connections to Line Segments

In order to program any of the antifuses, it must be possible to provide the programming voltage across each antifuse. As shown in FIG. 7b, each line segment N1, N2, E1, E2, S1, S2, W1 and W2 has a fixed connection through a transistor to one of the lines VP0 through VP3 in the programming bus. The programming bus must contain sufficient lines that interconnect line segments feeding opposite terminals of an antifuse are always connected to different lines in the programming bus so that different voltages can be applied to the opposite terminals of each antifuse. For a geometry in which lines enter a connection region from four compass points, four programming bus lines may be able to provide sufficient flexibility to always connect opposite terminals of each antifuse to different bus lines. However, if more varied connection patterns will be used, additional programming bus lines may be needed. A presently preferred embodiment uses five lines in the programming bus. Additional programming lines beyond four may program interconnect lines which interconnect alternating logic devices, for example. Five programming lines are shown in the embodiment of FIG. 7a.

FIG. 7b shows an arrangement for programming the 24 antifuses to connect interconnect line segments in four compass directions using a programming bus having four lines (or using four lines of a larger programming bus). By allocating each of the four compass directions to a different one of the four programming lines, it is possible to provide the necessary voltage difference to each of the 24 antifuses.

To program antifuse F1, segment N2 is connected to programming bus line VP0 through transistor T811 by addressing pumped decoder D811. (Addressing the decoders will be discussed in connection with FIGS. 7c and 7d.) Segment W1 is connected to programming bus line VP3 through transistor T816 by addressing pumped decoder D816. To connect segment N2 to segment W1 through antifuse F1, while transistors T811 and T816 are on, a first programming voltage is applied to programming voltage line VP0 and a second programming voltage is applied to programming voltage line VP3. There is typically a preferred direction for applying these programming voltages, depending on the makeup of the antifuse. With the present invention, it is possible to apply the two programming voltages in either direction, or indeed to apply sequential programming voltages of opposite polarities.

Low Resistance of Programmed Antifuses

Because the voltages on the gates of transistors T811 and T816 are pumped higher by at least one threshold voltage than the programming voltages applied to programming lines VP0 and VP3, the full voltage difference applied to programming lines VP0 and VP3 will appear at antifuse F1. Further, because the programming current must pass through only the two transistors T811 and T816 and antifuse F1 between the major voltage source which supplies the programming voltages and current, it is possible to pass high current through transistors T811 and T816 and antifuse F1 as antifuse F1 is being programmed. The effect of the high current is to reduce resistance between the two terminals of the antifuse. It is expected that typical resistance of such programmed antifuses will be on the order of 100 ohms.

FIG. 9 shows the relationship between the programming current and the final resistance of an antifuse. At a low programming current of some 4 mA, which cannot be exceeded by prior art designs in which programming current may pass through 5 to 8 transistors in series, resistance of the programmed antifuse will remain on the order of 200 to 900 ohms. Such values of resistance have a significant detrimental effect on circuit performance. The high resistance of such prior art designs causes signal delay, and the large spread in final resistance causes unpredictability of the delay, which may cause unacceptable circuit operation. By contrast, with the present invention, in which programming current is on the order of 15-20 mA, the approximately 100 ohm resistance of programmed antifuses is small in comparison with other resistances in the circuit, so that delay is both small and predictable, and resulting circuit performance is enhanced relative to the above described prior art.

FIGS. 8A and 8B show programming circuits of the prior art (FIG. 8A) and the present invention (FIG. 8B), and contrast the serial nature of a prior art programming circuit with the parallel nature of the present invention. Programmed antifuses are indicated by a solid black dot. As shown in FIG. 8A, when an antifuse is being programmed, current flows in series through programming transistors and the antifuse. For programming, a programming voltage, on the order of 17 volts in the present example, is applied to line segment 817, and ground voltage is applied to line segment 821. To program antifuse F2, high voltages are applied to the gates of transistors T0, T1, and T3, and a low voltage, zero volts, is applied to transistor T2. The programming voltage applied across antifuse F2 will be at least one threshold voltage below the voltage applied to the gates of transistors T0 and T1. When a high programming current is flowing, this voltage will also be lower than the voltage applied to segment 817 because of the resistance of transistors T0, T1 and T3. It can be seen that when the device is scaled to provide a larger number of transistors in series, the resistance of these transistors can produce a significant decrease in the current available for programming the desired antifuse.

By contrast, as shown in FIG. 8B, antifuses $FX_0$, $FX_1$, $FX_2$, and $FX_3$ are arranged in parallel between programming voltage lines VP0 and VP1. To program antifuse $FX_2$, current passes through only two transistors $TX_2$ and $TX_3$ regardless of how many antifuses are in the line and regardless of which other antifuses have been programmed.

Advantageously, the use of a parallel programming arrangement such as shown in FIG. 8B results in a smaller total silicon area (fewer and smaller programming transistors) for a particular amount of resistance, or a lower resistance for a particular silicon area.

Programming Transistor Resistance Estimation

Just as antifuse programmed resistance will vary from chip to chip, so also will the resistance of programming transistors vary from chip to chip. It is possible to obtain an improved estimate of on-resistance of the programming transistors of a chip by providing one or more pairs of test transistors manufactured by the same process as the programming transistors but connected directly between a pair of programming lines so that when the pair of test transistors is turned on, the resistance of the pair can be measured directly. It is presently considered sufficient to provide only a single pair of test transistors for determining the expected resistance of programming transistors in the entire chip. FIG. 8C shows a pair of resistance measurement transistors which are manufactured by the same process as those of FIG. 8B, but connected directly between programming lines VP0 and VP1. After programming of antifuses using programming transistors manufactured by the same process as M1 and M2, a voltage difference is applied between programming voltage sources VP0 and VP1 sufficiently low to cause measurement transistors M1 and M2 to operate in their linear range. Transistors M1 and M2 are then turned on and current through transistors M1 and M2 is measured. Programming transistors connecting programmed antifuses are also turned on and current through the antifuse is also measured. Resistance of the antifuses is calculated by assuming the programming transistors have resistance equal to that of measurement transistors M1 and M2.

Programmed Antifuse Resistance Calculation

Further, with the arrangement of FIG. 8B, not only can the programming current and voltage be high for a resulting low antifuse on-resistance, but the resistance of the programmed antifuse can be measured. If a low voltage, say 1 volt, is applied to a programmed antifuse by applying a logical one to the corresponding address and data lines and applying 1 volt to one of the programming lines and zero volts to the other programming line, the programming transistors will operate in their linear range (range in which resistance times current equals voltage). Resistance of the programming transistors can be closely estimated as described below, so that the equation $$V = I \times (R_{T1} + R_F + R_{T2})$$

where

V is the (one volt) applied voltage, $R_{T1}$ and $R_{T2}$ are the resistances of the corresponding programming transistors when operating in the linear range, and $R_F$ is the on-resistance of the programmed antifuse can be solved for antifuse resistance, since all other terms of the above equation are known or can be estimated. Further, as can be seen in FIG. 9, a high programming current of 15-20 mA produces not only a low resistance but a predictable resistance. The combination of low resistance and predictable resistance makes it both possible and less important to calculate the resistance of a particular signal path. Antifuse resistance may be calculated directly after the antifuse is programmed to determine that the antifuse is functioning properly.

Addressing Pumped Decoders

FIG. 7c shows an embodiment of the pumped decoder addressing means. Vertical address lines D0 through D4 and horizontal address lines A0 through A3 are shown. Each pumped decoder is addressed by one vertical line and one horizontal line. Also shown in FIG. 7c are four interconnect line segments, horizontal interconnect line segments X1 and X2 and vertical interconnect line segments Y1 and Y2. At the intersections of these horizontal and vertical line segments are four antifuses F1-1, F1-2, F2-1 and F2-2. Pumped decoder DX1, when addressed by address lines A3 and D0, causes transistor TX1 to turn on and connect programming line VP0 to interconnect line segment X1. Pumped decoder DX2, when addressed by address lines A2 and D0, causes transistor TX2 to turn on and connect programming line VP1 to interconnect line segment X2. Pumped decoder DY1, when addressed by address lines A1 and D2, causes transistor TY1 to turn on and connect programming line VP3 to interconnect line segment Y1. Pumped decoder DY2, when addressed by address lines A1 and D3, causes transistor TY2 to turn on and connect programming line VP2 to interconnect line segment Y2. To program antifuse F1-1, transistors TX1 and TY1 are turned on by applying high signals on address lines A3, D0, A1, and D2, and while these two transistors are on, applying sufficiently different programming voltages (typically 15 to 18 volts) to programming lines VP3 and VP0. From this description it can be seen how the other four antifuses of FIG. 7c are programmed, and indeed how antifuses in a larger array are programmed.

Sequential Addressing and High Capacitance Decoders

FIG. 7d shows an embodiment of the invention in which another novel and useful feature is employed. Again, assume antifuse F2-2 is to be programmed. In FIG. 7d, just as in FIG. 7c, transistors TX2 and TY2 must be turned on to program antifuse F2-2. In both FIG. 7c and FIG. 7d, transistors TX2 and TY2 are turned on by addressing lines D2, A2, (for TX2) and A1, D3 (for transistor TY2).

FIG. 7c, however, shows a sparse array in which these four lines may be simultaneously addressed without also turning on any additional transistors. However, with the array of FIG. 7d, if the four lines D2, A2, A1, and D3 are addressed simultaneously, the transistors for programming antifuse F1-2 are also turned on. The combination of lines A1 and D2 turns on transistor TY1 in addition to the desired result that the combination of lines A2 and D2 turns on transistor TX2.

It is desirable to be able to use a compact array such as shown in FIG. 7d in order to reduce silicon area. A novel feature of the present invention allows antifuses in such a compact array to be programmed without the above ambiguity.

Sequential Addressing of Antifuse Terminals

Instead of activating all four addresses of the two line segments simultaneously, the line segments are addressed in pairs sequentially, and the capacitance of the decoder circuit used to hold the first addressed programming transistor on until the second transistor has been addressed and the antifuse programmed. There is no possibility of addressing multiple antifuses, as occurs when simultaneous addresses on address lines A1 and D2 cause the programming of antifuse F1-2 (discussed above). With the sequential addressing of the present invention, as can be seen in FIG. 10, when antifuse F2-2 is to be programmed, address lines A1 and D2 are never addressed simultaneously, so decoder DY1 never turns on transistor TY1 to apply a programming voltage across antifuse F1-2.

Programming of an antifuse requires only on the order of one millisecond between the time programming voltages are applied to lines in the programming bus and antifuse programming is completed to achieve a typical resistance on the order of 100 ohms. Yet programming transistors held on by their corresponding pumped decoders for a time on the order of 10 ms after the corresponding address and data lines are no longer addressed. Thus sequential addressing of two programming transistors can be used to cause only the desired transistors to be turned on so that only the desired antifuse is programmed.

Timing for Sequential Addressing

For programming antifuse F2-2, assume that a high voltage will be applied to interconnect line segment X2 and a low voltage will be applied to interconnect line segment Y2. The timing sequence for this programming is shown in FIG. 10. Reference numerals in FIG. 10 have the same meaning as those in FIG. 7d. The decoder for the line segment to which the low voltage will be applied is preferably addressed first, and for a sufficient number of clock cycles to pump the decoder output node to its output voltage. In this case decoder DY2 for applying the low voltage to line segment Y2 is addressed by applying logical one (5 volt) voltages to address lines A1 and D3. These logical one address voltages are applied for a duration of less than one ms, causing the pumped decoder to turn on transistor TY2 and thereby select lie segment Y2. As shown in FIG. 10, this takes on the order of 10 to 100 microseconds. Address lines A1 and D3 are then deselected by placing logical zero first on line A1 and then on line D3. (see FIG. 6b) The logical zero on line A1 turns off transistor T5 and disables clock ϕA1, thereby isolating node 13 and retaining charge on the gate of transistor T52.

Next, the decoder for the line segment to which the high voltage will be applied is addressed. In this case, decoder DX2 for line segment X2 is addressed by applying logical 1 voltages to lines A2 and D3. This causes pumped decoder DX2 (preferably of the type shown in FIG. 6b) to raise the gate voltage on transistor TX2 to one threshold voltage above the voltages on the Vpp line, turning on transistor TX2 and selecting line segment X2. While line segment X2 is addressed, the high and low programming voltages are applied to the respective lines of the programming bus. That is, a high voltage (15 to 18 volts) is applied through programming bus line VP1 to line segment X2 while zero volt levels are applied to programming bus lines VP0, VP2, and VP3. The zero volt level on VP2 is transferred by transistor TY2 to line Y2, so that the programming voltage appears across antifuse F2-2.

Initially, the full programming voltage appears across the antifuse to be programmed, in this case antifuse F2-2. As programming occurs, the resistance of the antifuse drops, current through the antifuse increases, and the voltage difference across the antifuse decreases.

When programming is complete, the programming voltage is removed from the programming bus, and addressing voltages are removed from the second pair of address lines. Completion of programming may be established by a set time interval, by achieving an established programming current, or by removing the programming voltage and applying a voltage for measuring on-resistance (discussed earlier).

Benefit of First Addressing Low Voltage Line Segment

The reason the pumped decoder addressed first is preferably that decoder used to apply the low voltage to the antifuse, is that parasitic capacitance will tend to hold the corresponding programming transistor on after pumping ceases. Take the example shown in FIG. 7d of programming antifuse F2-2 with a high voltage to line segment X2 and a low voltage to line segment Y2. As current begins to flow through antifuse F2-2, the voltage on line segment Y2 approaches about 7 volts while the voltage on line segment X2 approaches about 8–9 volts. The voltage on plate P1 of parasitic capacitor CY2 will rise as antifuse F2-2 begins to conduct. The rising voltage on plate P1 induces a rising voltage on plate P2 of parasitic capacitor CY2. This rising voltage tends to hold transistor TY2 on during the full programming cycle even though pumped decoder DY2 is not being pumped when antifuse F2-2 is being programmed. During the one to two milliseconds in which this process takes place, the voltage on the gate of transistor TX2 is pulled down by the Miller capacitance of intrinsic capacitor CX2. But this effect is overcome by the current source from pumped decoder DX2 which is still addressed.

With the sequential addressing of the present invention, there is no possibility of an ambiguous programming address, as was discussed above in which simultaneous addresses on address lines A1 and D2 could cause the programming of antifuse F1-2, because as can be seen in FIG. 10, when programming antifuse F2-2, address lines A1 and D2 are never addressed simultaneously, so decoder DY1 never turns on transistor TY1 to apply a programming voltage across antifuse F1-2.

Global Clear Between Programming of Successive Antifuses

After programming an antifuse, in order to assure that no programming transistors are inadvertently addressed while the address is being moved from one transistor to another, the programming transistors turn off during a global clear operation (all address lines A0–An of an array such as shown in FIG. 7d are brought high and data lines D0–Dm are brought low during a transition period), after which time the next antifuse may be programmed.

Testing

Another benefit of the circuit of the present invention is that testing of logic devices and interconnect lines (i.e., the programming logic circuitry) can be performed using the programming bus and address lines, with no requirement for additional testing circuitry. As can be seen in FIGS. 6a and 6b and also in overview FIG. 7a, certain line segments extend to logic devices. Each logic device must be tested for proper performance before the device is shipped. However, the chip must be able to be tested without programming any of the antifuses available to the user, in order to make the full programmability available to the customer who will use the chip. Since certain of the interconnect lines connect directly to a logic device and through a programming transistor to one of the programming voltage lines, it is possible to use these programming transistors and programming voltage lines to apply test vectors to the logic devices. Any node in the antifuse array may be tested by selectively turning on programming transistors. For example, in FIG. 6a, by applying a test voltage to programming line VP0, and turning on transistor T52, the test voltage may be applied to logic device CLE1 without the need for programming an antifuse. Likewise, with the logic array of FIG. 7a, various test signals may be applied through various lines of the programming bus (not shown in FIG. 7a) to lines L51 through L54 by turning on appropriate programming transistors, thereby providing test signals to logic device 9-5.

Test Modes

Three modes of testing can be performed using the structure of the present invention, as shown in FIG. 6b, for example.

A first testing mode, called row mode, can apply logic signals to all interconnects and/or logic device inputs addressed by a particular row of address lines A1 through An in the array. In row mode, described in the summary above, the weak (resistive) pull-up transistors such as T6 are turned on by applying a logical one to nodes 16 and 17. Next, transistor T52 is selectively turned on by applying logical one to lines A1 and D1, which turns on transistor T5, and brings node 13 to roughly 4 volts. Given that VP0 through VP3 are all held at zero volts, the 4 volt level on node 13 is sufficient to hold transistor T52 on and apply a logical zero to node 9 in spite of the weak pull-up from transistor T6. During such test operations, the pump portion of pumped decoder D52 is not used.

Node 9 of FIG. 6b is connected to an interconnect line segment such as segments X1, X2, Y1, or Y2 of FIGS. 7c and 7d or segments L1 through L54 of FIG. 7a. By turning on an array of pull-up transistors such as transistor T6 of FIG. 6b, then simultaneously turning on a selected set of programming transistors such as T0 of FIG. 6b (or TX1, TX2, TY1, or TY2 of FIG. 7c and 7d) and thereby applying pull-down voltages to certain programming lines (such as X1, X2, Y1, Y2 of FIG. 7c and 7d) it is possible to control through the addressing structure (including lines A0 through A3 and D0 through D4 of FIG. 7c and 7d) which terminals of the logic devices receive high and low input signals, thus providing test vectors, without the need for separate testing lines for each input terminal of a logic device. This set of resistive pull-up transistors such as T6 provides pull-up voltages to lines not interconnected in the programmed logic array, and therefore serves the double purpose of preventing floating lines during circuit operation and providing a voltage source during testing. Row mode allows loading of many address or data lines in parallel so as to apply test vectors to a number of nodes simultaneously.

In a second mode, called direct input drive mode, node 13 is brought to 4 volts, as above. However, the test signal is placed directly on VP0 and this signal then drives the logic device input at node 9 directly through transistor T52. In this mode transistor T6 can be turned off. By applying 5 volts to Vpp, the pumped decoder D52 can be used to raise the voltage at node 13 to approximately 6 volts, thereby allowing the full rail to rail signal on programming line VP0 to be applied to the logic device input at node 9. This mode can be used when a single input needs to be driven at high speed.

In a third test mode, used for testing logic device output signals, node 9 is an output node from a logic device. In this mode, voltages at A1, D1, 16 and 17 are the same as in the second mode. However, line VP0 is used for detecting the signal applied by the logic device to node 9.

Output of the logic devices on output line segments L55 and L56 of logic device 9-5 (FIG. 7a) may be detected by turning on appropriate programming transistors directly connected to output line segments L55 and L56 of logic device 9-5. In order to avoid programming any antifuses during testing, the test voltages are typically 0 to 5 volts, much lower than the programming voltage of 15 to 18 volts which will program an antifuse.

Also preferably provided, though not specifically shown in FIG. 6b, are antifuses which allow line segments to be connected to high or low source voltages. This option allows a constant high or constant low voltage to be applied to any input terminal of a logic device not used for a particular logic function, so that terminal is not left floating.

Though only specific embodiments of the present invention have been described here in detail, other embodiments will become obvious to those skilled in the art in light of the above description, and are intended to fall within the scope of the present invention.

We claim:

1. A structure for programming an array of antifuses in an integrated circuit structure comprising:
   a set of programming voltage lines to which programming voltages can be applied;
   a plurality of antifuses;
   a plurality of interconnect line segments, each connected to one terminal of at least one of said antifuses; and
   a pass transistor having one current carying terminal connected to a respective interconnect line and another current carrying terminal connected to one of said programming voltage lines for selectively connecting each of said interconnect line segments to one of said programming voltage lines and applying a known voltage difference across each of said antifuses.

2. A structure for programming an array of antifuses in an integrated circuit structure as in claim 1 in which said pass transistor is controlled by a pumped decoder, said pumped decoder providing an output voltage sufficient to turn on said pass transistor in response to being addressed with voltages not sufficient to program said antifuses.

3. A structure for programming an array of antifuses in an integrated circuit structure as in claim 2 in which said pass transistor is an NMOS transistor and said pumped decoder provides to said control terminal of said pass transistor a turn-on voltage of magnitude higher than a magnitude of said programming voltages.

4. A structure for programming an array of antifuses in an integrated circuit structure as in claim 1 in which some of said interconnect line segments connect to logic devices in said integrated circuit structure, whereby said programming voltage lines can be used for testing said logic devices without need for programming said antifuses.

5. The structure of claim 1, further comprising means for testing the structure.

6. The structure of claim 5, wherein the means for testing includes resistive means connected between the means for selectively connecting and a supply voltage.

7. A structure for programming an array of antifuses comprising:
   a set of programming voltage lines to which programming voltages can be applied;
   a plurality of antifuses;
   connecting means for connecting a different one of the programming voltage lines to each terminal of an antifuse; and
   pumping means connected to each of the connecting means for programmably applying a pumped control voltage higher than the programming voltages for causing the programming voltages to be applied to the terminals of the antifuse.

8. A method for programming an antifuse in an integrated circuit structure comprising the steps of:
   addressing an interconnect line attached to a first terminal of said antifuse, thereby causing said first terminal to be connected to a first programming voltage line;
   addressing an interconnect line attached to a second terminal of said antifuse, thereby causing said second terminal to be connected to a second programming voltage line, in which said steps of addressing said interconnect lines attached to said first and second terminals of said antifuse are performed sequentially such that a time at which said first interconnect line is addressed does not overlap with a time at which said second interconnect line is addressed; and
   simultaneously applying a first programming voltage to said first programming voltage line and a second programming voltage to said second programming voltage line, thereby causing said antifuse to become permanently conductive.

9. A method for programming an antifuse in an integrated circuit structure comprising the steps of:
   addressing a first interconnect line attached to a first terminal of said antifuse, thereby causing said first terminal to be connected to a first programming voltage line;
   addressing a second interconnect line attached to a second terminal of said antifuse, thereby causing said second terminal to be connected to a second programming voltage line;
   simultaneously applying a first programming voltage to said first programming voltage line and a second programming voltage to said second programming voltage line, thereby causing said antifuse to become permanently conductive; in which:
   said step of addressing said first interconnect line comprises applying addressing voltages to horizontal and vertical address lines connected to a first decoder which turns on a first transistor which connects said first interconnect line to said first programming voltage line; and said step of addressing said second interconnect line comprises applying addressing voltages to horizontal and vertical address lines connected to a second decoder which turns on a second transistor which connects said second interconnect line to said second programming voltage line.

10. A method for programming an antifuse in an integrated circuit structure as in claim 9 in which said transistors are NMOS transistors and said first transistor has a capacitance sufficient to remain turned on after no longer being addressed such that said first programming voltage line remains connected to said first interconnect line while said second programming voltage line is connected to said second interconnect line.

11. A method for programming an antifuse in an integrated circuit structure as in claim 9 in which said step of applying addressing voltages to said first decoder is performed before said step of applying addressing voltages to said second decoder.

12. A method for programming an antifuse as in claim 11 in which said first programming voltage applied to said first programming voltage line is a lower voltage than said second programming voltage applied to said second programming voltage line.

13. A method for determining programmed resistance of an antifuse in a structure having a plurality of antifuses each positioned between a pair of programming transistors, each pair of programming transistors programmably connecting a corresponding antifuse between programming voltage sources, and at least one pair of measurement transistors formed to be like said programming transistors and connected in series between said programming voltage sources without an intervening antifuse, comprising the steps of: programming said antifuses;

applying a voltage difference between said programming voltage sources sufficiently low to cause said measurement transistors to operate in their linear range;

turning on said measurement transistors;

measuring current through said measurement transistors and calculating resistance of said measurement transistors;

turning on programming transistors connecting said antifuse to said programming voltage sources;

measuring current through said programming transistors and said antifuse; and calculating resistance of said antifuse assuming said programming transistors have resistance equal to that of said measurement transistors.

14. A structure for measuring resistance in a programmed antifuse in an array of antifuses in an integrated circuit structure comprising:

a set of programming voltage lines to which programming voltage can be applied;

a plurality of antifuses;

for each antifuse a first programming voltage transistor for programmably connecting a first terminal of said antifuse to a first one of said programming voltage lines, and a second programming voltage transistor for programmably connecting a second terminal of said antifuse to a second one of said programming voltage lines;

at least one pair of measurement transistors connected in series between two of said programming voltage lines, said measurement transistors being manufactured to have the same resistance characteristics as said programming transistors;

whereby resistance of said measurement transistors can be measured and used as a reliable estimate of resistance of said programming transistors.

* * * * *